(12) United States Patent
Shaviv et al.

(10) Patent No.: US 7,745,332 B1
(45) Date of Patent: Jun. 29, 2010

(54) PVD-BASED METALLIZATION METHODS FOR FABRICATION OF INTERCONNECTIONS IN SEMICONDUCTOR DEVICES

(75) Inventors: Roey Shaviv, Palo Alto, CA (US); Alexander Dulkin, Sunnyvale, CA (US); Neil Mackie, Fremont, CA (US); Daniel Juliano, Santa Clara, CA (US); Robert Rozbicki, San Francisco, CA (US)

(73) Assignee: Novellus Systems, Inc., San Jose, CA (US)

( * ) Notice: Subject to any disclaimer, the term of this patent is extended or adjusted under 35 U.S.C. 154(b) by 105 days.

(21) Appl. No.: 12/074,168

(22) Filed: Feb. 29, 2008

(51) Int. Cl.
*H01L 21/44* (2006.01)

(52) U.S. Cl. ............... 438/679; 438/676; 257/E21.295; 257/E21.169; 257/E21.161

(58) Field of Classification Search ................. 438/679, 438/676, 674, 680, 695; 251/E21.294, E21.295, 251/E21.159, E21.16, E21.169, E21.17, E21.171, 251/E21.161
See application file for complete search history.

(56) References Cited

U.S. PATENT DOCUMENTS

| 4,999,096 | A | | 3/1991 | Nihei et al. |
|---|---|---|---|---|
| 5,882,488 | A | * | 3/1999 | Leiphart ................. 204/192.32 |
| 6,184,137 | B1 | | 2/2001 | Ding et al. |
| 6,214,711 | B1 | * | 4/2001 | Hu ............................. 438/589 |
| 6,398,929 | B1 | | 6/2002 | Chiang et al. |
| 6,605,197 | B1 | | 8/2003 | Ding et al. |
| 6,884,329 | B2 | | 4/2005 | Wang et al. |
| 6,899,796 | B2 | | 5/2005 | Wang et al. |
| 2002/0153610 | A1 | * | 10/2002 | Stumborg et al. ............ 257/751 |
| 2004/0134769 | A1 | * | 7/2004 | Wang et al. ............. 204/192.17 |
| 2004/0188239 | A1 | * | 9/2004 | Robison et al. ........... 204/192.3 |
| 2006/0024939 | A1 | * | 2/2006 | Grunow et al. .............. 438/596 |
| 2006/0030151 | A1 | * | 2/2006 | Ding et al. ................. 438/687 |
| 2009/0095617 | A1 | * | 4/2009 | Lee et al. ................ 204/192.15 |

FOREIGN PATENT DOCUMENTS

EP 0878843 A2 11/1998

OTHER PUBLICATIONS

Microelectronic Engineering 33 (1997) pp. 31-38, "Gap filling with PVD processes for copper metallized integrated circuits".

* cited by examiner

*Primary Examiner*—Caridad M Everhart
(74) *Attorney, Agent, or Firm*—Weaver Austin Villeneuve & Sampson LLP

(57) ABSTRACT

Recessed features on a Damascene substrate are filled with metal using plasma PVD. Recessed features having widths of less than about 300 nm, e.g., between about 30-300 nm can be filled with metals (e.g., copper and aluminum), without forming voids. In one approach, the deposition is performed by exposing the substrate to a high-density plasma characterized by high fractional ionization of metal. Under these conditions, the metal is deposited within the recess, without forming large overhang at the opening of the recess. In some embodiments, the metal is deposited within the recess, while diffusion barrier material is simultaneously etched from the field region. In a second approach, recessed features are filled by performing a plurality of profiling cycles, wherein each cycle includes a net etching and a net depositing operation. Etching and depositing parameters are adjusted such that the recessed features are filled without forming overhangs and voids.

62 Claims, 15 Drawing Sheets

PVD-BASED METALLIZATION METHODS FOR FABRICATION OF INTERCONNECTIONS IN SEMICONDUCTOR DEVICES

FIELD OF THE INVENTION

The present invention pertains to methods of fabricating interconnections in semiconductor devices. The methods employ physical vapor deposition (PVD) for filling recessed features on partially fabricated semiconductor devices with metals. The methods are particularly useful for filling vias and trenches in a Damascene substrate with copper.

BACKGROUND OF THE INVENTION

Currently used integrated circuit (IC) fabrication methods commonly involve deposition of metals into recessed features formed in a layer of inter-layer dielectric (ILD). The deposited metal provides the conductive paths which extend horizontally and vertically within the IC substrate, connecting the active devices (e.g., transistors) in a desired pattern. The metal lines formed in adjacent ILD layers are connected to each other by a series of interconnections (interconnects). On a typical wafer substrate, one or several layers of dielectric are deposited onto a layer containing the active devices, and are patterned to provide vertical and horizontal recessed features (vias and trenches) which are subsequently filled with metal. The resulting layer containing metal-filled lines residing in a dielectric is referred to as a metallization layer. Next, a second metallization layer is similarly formed on top of the first metallization layer and interconnects are formed between the two metallization layers. A stack containing several metallization layers which are electrically connected to each other by a plurality of interconnects, can be similarly formed using this process flow. The described process, known as Damascene processing, is particularly advantageous when copper is used as a metallization metal, because copper is not easily amenable to plasma etching, and therefore cannot be easily patterned. Copper is a commonly used metal in modern devices due to its low resistivity and high electromigration resistance. Aluminum is another frequently used metallization metal.

With the miniaturization of IC devices, the dimensions of the device features have dramatically decreased. Specifically, the widths of the recessed features in current IC devices are typically less than 200 nm, often less than 100 nm. Filling of these recessed features with metals presents many challenges. In particular, the difficulty of depositing metals into narrow recesses without forming microvoids or defects, has prevented the use of PVD methods for metal gap fill at a current level of miniaturization. In the case of copper, the copper fill is currently accomplished by depositing a thin conformal copper seed layer by PVD, followed by deposition of a bulk amount of copper by electroplating. The seed layer serves as an electrical contact on a wafer during electroplating.

For some applications, it is preferable to minimize process steps, in order to decrease processing times and production costs. Specifically, the ability to perform PVD-only metal fill would be desirable.

However, the goal of PVD-only metal fill has been difficult to attain. The majority of currently known methods for PVD metal fill are applicable only to metal deposition in very wide and shallow features. With the use of conventional PVD in narrow and high aspect ratio features, the metal sputtered from the metal target tends to accumulate at the opening of the recessed feature, causing formation of overhangs, and, ultimately, leading to formation of voids within the filled feature.

Currently, there is a need for PVD-based methods that would allow for partial or complete metal fill in relatively narrow features without formation of voids. For certain applications, such methods may completely eliminate the necessity for wet processing (e.g., electroplating). Further, such methods may eliminate the need for subsequent CMP removal of the metal from the field, further improving efficiency of IC fabrication.

SUMMARY OF THE INVENTION

This need is herein addressed by providing methods and apparatus for PVD metal gap fill. According to these methods, recessed features on a Damascene substrate are filled with metal using plasma PVD (ionized PVD or iPVD). Recessed features having widths of less than about 200 nm, can be filled with metals (e.g., copper or aluminum), without forming voids. It is understood that the described methods are also applicable to filling wider features.

In one approach, the deposition is performed by exposing the substrate to high-density plasma characterized by high fractional ionization of metal. Under these conditions, the metal can be selectively deposited within the recess, without forming overhangs at the opening of the recess or without appriciable deposition in the field between the features. In some embodiments, the metal is deposited within the recess, while diffusion barrier material is simultaneously etched from the field region. The described approach will be referred to as High Density Plasma Metal Fill.

In a second approach, recessed features are filled by performing a plurality of profiling cycles, wherein each cycle includes a net etching operation and a net depositing operation. Etching and depositing parameters are adjusted such that the recessed features are filled without forming large overhangs. As a result, formation of voids is prevented. This approach will be referred to as Atomic Layer Profiling (ALP) Metal Fill.

In some embodiments, the described PVD gap fill methods are integrated into Damascene process flow. According to one embodiment, a method of fabricating a semiconductor device structure includes the operations of (a) forming a recessed feature in a layer of dielectric, wherein the recessed feature has a width of less than about 200 nm; (b) depositing a layer of diffusion barrier material (e.g., Ta, $TaN_x$, $TiN_x$, $Ti_xW_y$, Ru, etc.) over the surface of the wafer substrate; (c) completely filling the recessed feature with a metal-containing material (e.g., with Cu, Al, Ag, Au, Mo, or with a variety of alloys) using PVD; (d) optionally annealing the deposited material after the recessed feature is filled; (e) if needed, removing the excess of the filling material along with the barrier material from the field; and (f) depositing a second layer of dielectric over the surface of the wafer substrate. Both ALP Metal Fill and High Density Plasma Metal Fill can be used to perform the method described above.

Remarkably, in some embodiments, deposition of metal by High Density Plasma Metal Fill can be performed such that the recessed feature is filled with metal, while the layer of diffusion barrier material is simultaneously etched from the field region of the substrate. Because diffusion barrier material may be completely removed from the field region during such operation, a separate planarization operation, such as chemical mechanical polishing (CMP) operation may not be required prior to deposition of a second dielectric layer. The post deposition annealing may also be eliminated due to self-annealing conditions for the metal layer deposited in certain embodiments of High Density Plasma Metal Fill process.

According to one aspect, the PVD metal gap fill is performed by exposing the substrate having a recessed feature (gap) and a field region to a high density plasma characterized by high fractional ionization of metal. In one embodiment the deposition method includes: (a) positioning the partially fabricated device in a PVD process chamber; and (b) depositing the metal-containing material (e.g., Cu, Al, or an alloy) on at least the bottom portion of the recessed feature at a first net deposition rate, while simultaneously depositing the material on the field region at a lower net deposition rate or while not simultaneously depositing the material on the field region (e.g., while etching an exposed layer of diffusion barrier material on the field). The deposition is accomplished by exposing the partially fabricated semiconductor device to the plasma characterized by at least about 50% fractional ionization of metal. In some embodiments, fractional ionization of metal is at least about 80%, e.g., at least about 99%.

The ability of depositing the metal within the recessed feature while simultaneously etching material from the field region or while depositing metal in the field region at a lower rate, is highly unusual for an iPVD method, which is conventionally characterized by an opposite deposition selectivity, that is, by higher deposition rates in the field compared to the recess bottom. Unexpectedly, the use of high density plasma characterized by high fractional ionization of metal, resulted in reversal of the selectivity and enabled bottom-up recess fill without formation of substantial overhangs at the recess opening.

High density plasma suitable for deposition of metals in this regime is obtained, in some embodiments, by using highly magnetically confined plasma. In one embodiment, high magnetic confinement produces plasma having a plasma density of at least about $10^{12}$ electrons/cm$^3$ in the proximity of the wafer substrate. For example, a plasma having a plasma density of at least about $10^{13}$ electrons/cm$^3$ may be generated in the proximity of PVD metal target under high magnetic confinement, resulting in plasma density of at least about $10^{12}$ electrons/cm$^3$ at the wafer surface. High density plasma suitable for PVD metal fill may be obtained in a variety of PVD apparatus types. In one embodiment, the PVD metal gap fill is performed in an apparatus having a three-dimensional target, e.g., in an apparatus comprising a hollow cathode magnetron (HCM). In other embodiments, the high density plasma characterized by high fractional ionization of metal can be generated in an apparatus comprising a planar magnetron.

According to another aspect, PVD metal gap fill is performed using an atomic layer profiling (ALP) approach. In one embodiment of the ALP method, the recessed feature on a semiconductor substrate is filled with a metal-containing material (e.g., with Cu or Al) by a method which includes the operations of (a) depositing a layer of metal-containing material on the semiconductor substrate to coat at least a bottom portion of the recessed feature; and (b) performing a plurality of profiling cycles to fill the recessed feature with the metal-containing material. Each profiling cycle includes a net etching operation removing a first portion of a material residing at the bottom of the recessed feature and a net deposition operation depositing a second portion of a material at the bottom of the recessed feature. The net etching operation redistributes the metal-containing material from the bottom portion of the recessed feature to the sidewalls of the recessed feature in at least some profiling cycles. In some profiling cycles the net etching operation may serve to reduce overhangs residing at the opening of the recessed feature. The ALP cycles can be performed in a PVD process chamber, e.g., in an apparatus comprising an HCM or a planar magnetron. During net deposition operation the recess is exposed to a metal flux directed from the PVD target, which typically resides above the wafer. During net etching operation the recess is exposed to the metal flux directed predominantly from the recess bottom to the recess sidewalls (while a minor component of metal flux directed from the target and the field region may be also present, in some cases). Therefore, profiling cycles expose the sidewalls of the recessed feature to alternating metal fluxes coming onto the sidewalls from different directions. As a result, the ALP-based method fills the recess with metal from the sides, without forming large overhangs at the opening of the recess.

According to another aspect, an apparatus for filling the recesses on a partially fabricated IC substrate is provided. The apparatus includes: (a) a process chamber configured to hold a metal target (e.g., copper or aluminum target) for sputtering metal-containing materials onto the semiconductor wafer; (b) a wafer support for holding the wafer in position during deposition of the material; and (c) a controller comprising program instructions for forming a plasma characterized by at least about 50% fractional ionization of metal in the proximity of the substrate, and instructions for depositing the metal-containing material using this plasma on at least the bottom portion of the recessed feature at a first net deposition rate while simultaneously depositing the material on the field region at a lower net deposition rate or while not simultaneously depositing the material on the field region (e.g., etching a diffusion barrier material from the field).

According to another aspect, an apparatus for filling the recessed features on a partially fabricated IC substrate includes: (a) a process chamber configured to hold a metal target (e.g., copper or aluminum target) for sputtering metal-containing materials onto the semiconductor wafer; (b) a wafer support for holding the wafer in position during deposition of the material; and (c) a controller comprising program instructions for (i) depositing a layer of the metal-containing material on the semiconductor substrate, to coat at least a bottom portion of a recessed feature; and (ii) performing a plurality of profiling cycles to fill the recessed feature with the metal-containing material. The instructions specify parameters for each profiling cycle, such that each profiling cycle includes a net etching operation removing a first portion of a material residing at the bottom of the recessed feature and a net deposition operation depositing a second portion of a material at the bottom of the recessed feature, wherein the net etching operation redistributes the metal-containing material from the bottom portion of the recessed feature to the sidewalls of the recessed feature in at least some profiling cycles.

The described methods and apparatus can be used for complete or partial metal PVD fill of a variety of recessed features on a partially fabricated substrate, including vias, trenches, and contact holes.

These and other features and advantages of the present invention will be described in more detail below with reference to the associated drawings.

DETAILED DESCRIPTION OF PREFERRED EMBODIMENTS

Introduction and Overview

Figure 1A:
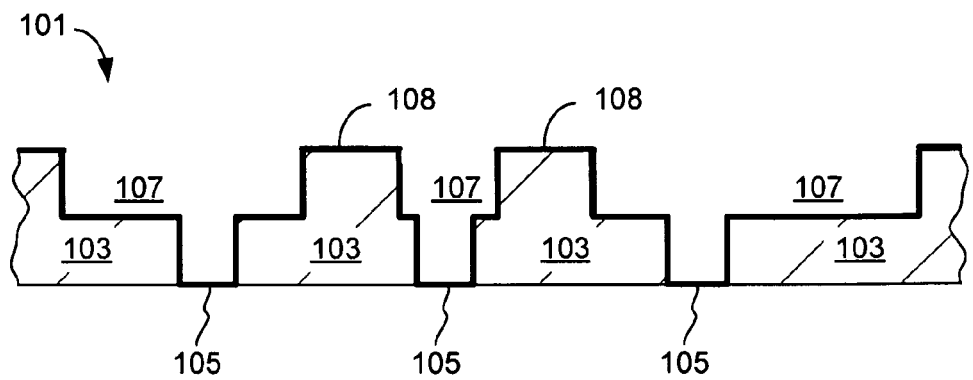
FIGS. 1A-1F show cross sectional depictions of device structures created during a copper dual Damascene fabrication process.

As it was mentioned, methods for filling recessed features on semiconductor substrates are herein provided. The described methods can be used for depositing a variety of metals which include but are not limited to copper, aluminum, titanium, silver, tantalum, tungsten and molybdenum. The methods can be also used for partially or completely filling the recessed features with metal alloys, such as copper alloys and aluminum alloys. For example, alloys of copper or aluminum with certain metals and non-metallic elements are used to improve electromigration performance of IC devices (e.g., Cu—Ti alloy). Further, some alloys may be deposited directly onto dielectric to self-form diffusion barrier layers. For example, alloys of copper with magnesium or with manganese can provide self-forming diffusion barrier layers, due to oxidation of Mg or Mn on the surface of dielectric. In general a variety of alloys may be deposited using described methods, including Cu—Mg, Cu—Mn, Cu—Al, Al—Si, etc. A PVD target made of a suitable metal alloy can be used for alloy deposition according to the provided methods. The methods may be used for partially or completely filling different types of recessed features, such as trenches, vias, and contact holes. The methods enable metal fill by PVD, specifically by plasma PVD (ionized PVD or iPVD). Unlike conventionally used electrofill methods, PVD metal fill can be performed without exposing the substrate to an ambient atmosphere or to wet chemistry. Further, the described methods typically do not require pre-deposition of distinct metal seed layers prior to PVD fill of the recessed features. Further, in some embodiments, the methods are capable of filling the recessed features with a metal while simultaneously removing material (such as diffusion barrier material) from the field region of the substrate. In this case, the need for a separate planarization operation, which is conventionally performed after the recessed features are filled, can be eliminated. In addition, in some embodiments, the PVD-deposited metal (e.g., copper) is self-annealed during deposition. The self-annealed metal has a microstructure characterized by large grain size, which correlates with high conductivity and "bamboo"-like grain orientation which correlates with high electromigration resistance. In conventional methods, the microstructure of electrodeposited metal was changed from a small-grain to a large-grain by a separate annealing operation. In some PVD-based filling methods described herein, the annealing operation may not be required, since the PVD-deposited metal is already deposited in a large-grain preferentially oriented form.

In order to frame the context of this invention, a brief description of a copper dual Damascene process for forming a partially fabricated integrated circuit is described below. The presented methods are not limited to a dual Damascene process and can be used in other processing methods, e.g., in single Damascene processing. While provided methods are particularly advantageous for processing substrates having relatively narrow recessed features with widths of about 300 nm and less (e.g., in the range of about 30-300 nm), they can be equally well applied to filling wider recesses.

Presented in FIGS. 1A-1E, is a cross sectional depiction of device structures created at various stages of a dual Damascene fabrication process. A cross sectional depiction of a completed structure created by the dual Damascene process is shown in FIG. 1F. Referring to FIG. 1A, an example of a typical substrate 101 used for dual Damascene processing is illustrated. The substrate 101 may reside on a layer carrying active devices, such as transistors, or on an underlying metallization layer containing copper lines or other type of metallization. The substrate 101 is built on a semiconductor wafer and is therefore referred to as a semiconductor substrate. The term semiconductor substrate, as used herein, refers to a substrate which contains a semiconductor material anywhere within the structure.

Substrate 101 includes a pre-formed dielectric layer 103 (such as fluorine or carbon doped silicon dioxide or organic-containing low-k material) with etched line paths 107 (trenches and vias) and a field region 108. A thin diffusion barrier layer 105 is deposited conformally to coat the substrate surface both within the recesses and in the field. Diffusion barrier material is needed to protect the dielectric layer 103 and underlying active devices from diffusion of copper ions. Suitable diffusion barrier materials include tantalum, tantalum nitride, titanium nitride, titanium tungsten, and the like. In a typical process, barrier 105 is formed by a physical vapor deposition (PVD) method, although atomic layer deposition (ALD) and chemical vapor deposition (CVD) may also be used. In an alternative process flow, the PVD metal fill methods described herein may be used to deposit a self-forming diffusion barrier layer (e.g., a Cu—Mg, or Cu—Mn alloy) directly onto the dielectric layer, and, if desired, to proceed with filling the recessed feature with such alloy. Magnesium and manganese are capable of forming a layer of oxide on the surface of dielectric, and to thereby prevent diffusion of copper into an adjacent dielectric layer.

Returning to the process flow depicted in FIG. 1A, after the copper diffusion barrier layer 105 has been deposited, the recessed features 107 are filled with copper. Conventionally used methods required deposition of a thin conformal copper seed layer on top of barrier layer 105, followed by electrodeposition of bulk copper to fill the recesses 107. This two-step operation requires substrate transfer from a PVD apparatus where the seed layer was deposited to a copper electrofill apparatus, where the recesses 107 are filled. This necessarily exposed the partially fabricated substrate to ambient atmosphere and to wet chemistry that is used during electrofill operation. In general, it would be preferable to minimize substrate transfers between apparatuses during IC fabrication. Further, exposure of the substrate to moisture and oxygen should be preferably minimized. In this respect, direct PVD copper fill offers many advantages over conventional two step PVD seed/copper electrofill process. Specifically, PVD copper fill can be performed in a dry vacuum environment using plasma PVD process chamber, without exposing the substrate to ambient atmosphere. Further, with direct PVD copper fill, deposition of a seed layer is not required. Thus, the vias and trenches may be filled with copper immediately after the copper diffusion barrier layer 105 has been deposited. For example, the substrate may be transferred from a tantalum or titanium PVD chamber used for diffusion barrier deposition to a copper PVD chamber for copper PVD fill. In some embodiments, the transfer can be done in one PVD system containing multiple PVD chambers without exposing the substrate to an ambient atmosphere containing moisture and oxygen.

Despite the many advantages of direct PVD fill, no copper PVD fill methods have been developed that would successfully fill recessed features with widths of less than about 300 nm. To date, only shallow and low aspect ratio recesses were filled with conventional iPVD. This is primarily due to the fact that conventional PVD (including iPVD) deposits larger amounts of material onto the field region of the substrate as compared to the bottom portions of a recessed feature. As a result, excess material deposited onto the field readily forms overhangs at the recess openings. In narrow recessed features the growing overhangs lead to pinch-off and to formation of voids within the recesses.

The present invention provides new iPVD methods which minimize this problem and allow direct PVD fill of recessed features with widths of less than about 300 nm, less than about 200 nm, and even less than about 100 nm. Recessed features with aspect ratios of greater than 2:1, and even 5:1 can be filled. As a result, PVD copper fill can be successfully integrated into Damascene process at a current level of miniaturization, at least for some metallization layers. Detailed description of PVD deposition conditions and process parameters used by these methods will be provided in the following sections.

Figure 1C:
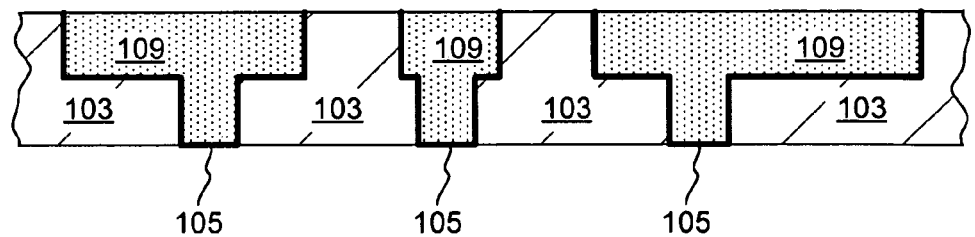
Figure 2A:
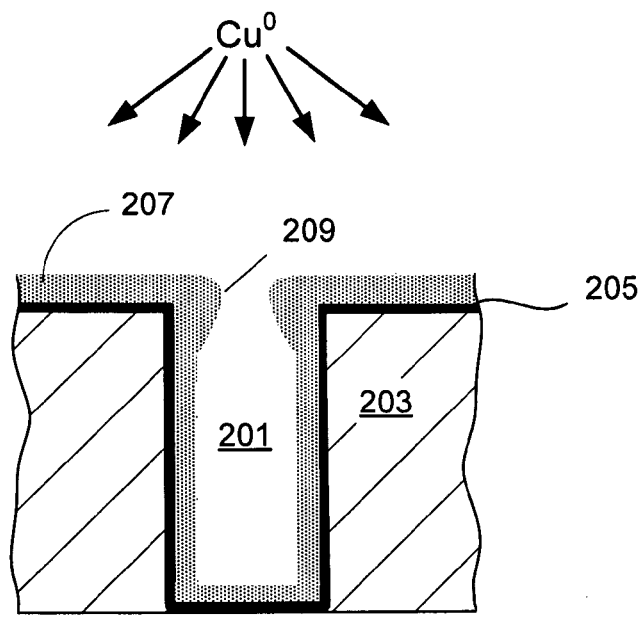
FIGS. 2A-2B show cross sectional depictions of device structures obtained during conventional PVD metal fill.

The direct PVD fill methods, in one embodiment, are performed such that copper is deposited both within the recessed features 107 and on the field region 108, resulting in a structure shown in FIG. 2A. FIG. 2A illustrates a copper layer 109 which is deposited into the features with an overburden, which resides on top of diffusion barrier layer 105 both over the field and over the filled recesses. All conductive material residing on the field (which includes both copper overburden and diffusion barrier residing on the field) is subsequently removed from the field region to prevent shorting between adjacent interconnects. This is performed by a planarization operation, such as CMP. The resulting planarized structure is shown in FIG. 1C, where it can be seen that diffusion barrier 105 and copper overburden have been removed from the field region and that the dielectric layer 103 is exposed.

Figure 1B:
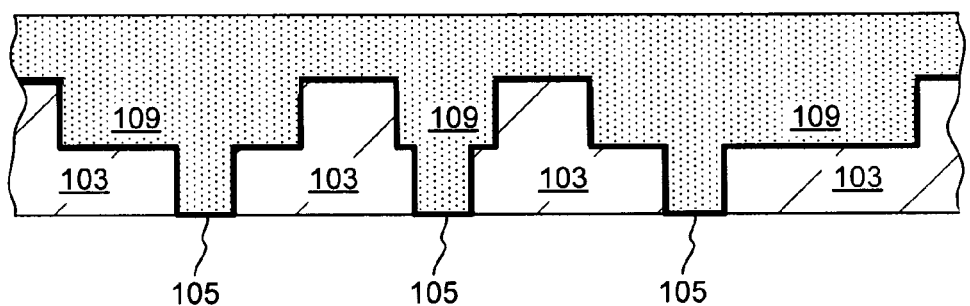

Remarkably, in one embodiment of High Density Plasma Metal Fill, it is possible to arrive directly from the structure shown in FIG. 1A to the structure shown in FIG. 1C, without forming an intermediate structure with copper overburden shown in FIG. 1B. In this embodiment, PVD plasma conditions are adjusted such that copper is deposited within the recesses 107, while diffusion barrier material is simultaneously removed from the field region as a result of plasma etching (resputtering). Remarkably, in this embodiment, not only formation of copper overburden is avoided, but undesired diffusion barrier material is removed from the field. When performed with high degree of control, this method may afford structures, for which CMP operation is unnecessary, or only very small amount of planarization is needed. This modification of Damascene process can greatly reduce IC device fabrication costs.

After the copper layer 109 has been formed, it is usually annealed by exposing the substrate to high temperature. Annealing improves the microstructure of deposited copper by enhancing the copper grain size. It is noted that in some embodiments, plasma deposition conditions are adjusted such that copper is deposited with a desirable large-grain microstructure, and an annealing operation may not be performed. This will also result in savings of fabrication costs.

Figure 1D:
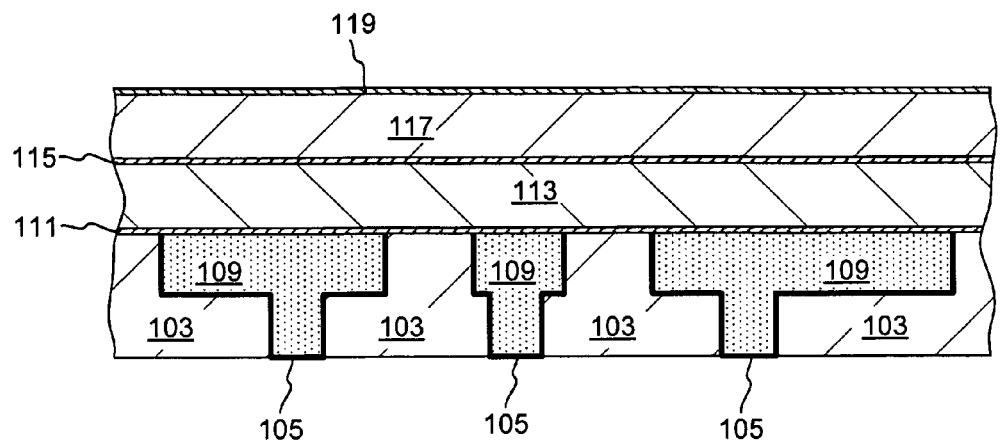

After the structure shown in FIG. 1C is formed, the dual Damascene process follows by building the next metallization layer. As depicted in FIG. 1D, a silicon nitride or silicon carbide diffusion barrier 111 is deposited to encapsulate conductive routes 109. Next, a first dielectric layer, 113, of a dual Damascene dielectric structure is deposited on diffusion barrier 111. The dielectric 113 is typically a low-k dielectric, such as described above for the layer 103. This is followed by deposition of an etch-stop layer 115 (typically composed of silicon nitride or silicon carbide) on the first dielectric layer 113. Layers 111, 113, and 115 can be deposited by CVD and plasma enhanced CVD (PECVD) methods from a variety of silicon, oxygen, carbon, and nitrogen containing precursors.

The process follows, as depicted in FIG. 1D, where a second dielectric layer 117 of the dual Damascene dielectric structure is deposited in a similar manner to the first dielectric layer 113, onto etch-stop layer 115. Deposition of an antireflective layer 119, typically containing BARC materials, follows.

Figure 1E:
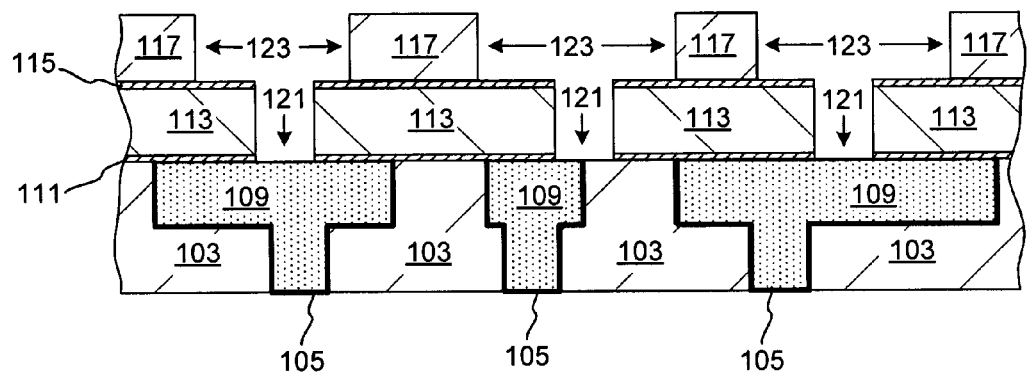
Figure 1F:
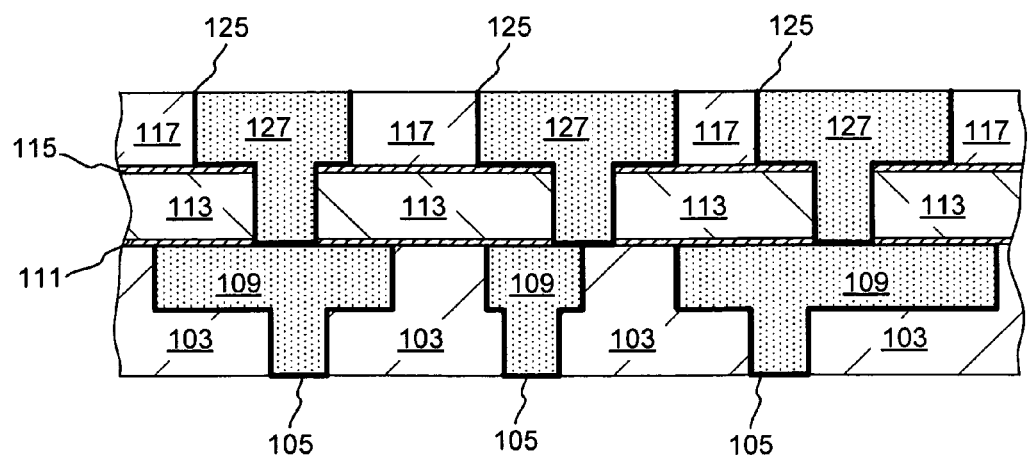

The dual Damascene process continues, as depicted in FIGS. 1E-1F, with etching of vias and trenches in the first and second dielectric layers. First, vias 121 are etched through antireflective layer 119 and the second dielectric layer 117. Standard lithography techniques are used to etch a pattern of these vias. The etching of vias 121 is controlled such that etch-stop layer 115 is not penetrated. As depicted in FIG. 1E, in a subsequent lithography process, antireflective layer 119 is removed and trenches 123 are etched in the second dielectric layer 117; vias 121 are propagated through etch-stop layer 115, first dielectric layer 113, and diffusion barrier 111.

Next, as depicted in FIG. 1F, these newly formed vias and trenches are coated with a diffusion barrier 125 and are subsequently filled with copper using PVD fill methods described herein. When copper fill is performed with overburden, the structure is then planarized to remove the copper overburden and portions of diffusion barrier material 125 (e.g., $TaN_x$, $TiN_x$, etc.) residing in the field region. Alternatively, PVD fill methods can simultaneously fill the recesses with copper while removing diffusion barrier material from the field region. The completed dual Damascene structure is shown in FIG. 1F, where PVD-deposited copper inlay 127 resides within dielectric and is separated from the dielectric layers 113 and 117 by a diffusion barrier layer 125.

Copper routes 127 and 109 are now in electrical contact and form conductive pathways, as they are separated only by diffusion barrier 125, which is also somewhat conductive. Three such interconnects are shown in FIG. 1F.

The methods provided herein can be used for depositing other metals beyond copper and its alloys. For example, aluminum may also be deposited by direct PVD fill. Further, the described methods need not necessarily be used for completely filling the recessed features. In some embodiments, it may be found desirable, to partially fill the recessed feature by PVD, and then follow by depositing additional metal by a CVD fill or electrofill. In another embodiment it may be found desirable to partially fill the recessed feature by a first PVD process and than follow by depositing additional metal by a second PVD process under different PVD conditions.

Two embodiments of direct PVD fill methods will be now described in detail. Both embodiments can be practiced in a PVD apparatus, configured for generation of plasma. One embodiment makes use of high density plasma metal deposition. In the second embodiment the recessed features are filled using a number of short etching and depositing operations. The first embodiment will be referred to as "High Density Plasma Metal Fill". The second embodiment will be referred to as "Atomic Layer Profiling (ALP) Metal Fill". In order to provide a context for PVD metal fill methods, a brief overview of PVD and resputter (sputter etch) will now be provided.

During deposition in a plasma PVD apparatus, according to one implementation, the wafer substrate is placed into the process chamber, which is configured for plasma generation. The process chamber includes a metal target which accepts a negative DC bias and serves as a source of metal flux during deposition; a wafer pedestal which holds the wafer in position during material processing and which also provides temperature control of the wafer; an inlet for introduction of an inert gas; and one or several magnets for confining the plasma in the proximity of the target. An RF bias can be optionally applied to the wafer. When net deposition of material is desired, typically no bias or only a small bias is applied to the wafer. After the wafer substrate is secured on the wafer pedestal, and the inert gas (e.g., argon) is introduced into the chamber, the plasma is ignited by applying a DC power to the target and confining the plasma with the use of magnetic field in the proximity of the target. Argon is positively ionized in the plasma to form $Ar^+$ ions which impinge on a negatively charged target with a sufficient momentum to dislodge metal atoms from the target. The neutral metal atoms dislodged from the target can be further ionized in the plasma. The metal species including neutral and ionized metal are being sputtered from the target onto the wafer and deposit on the wafer surface.

The positively charged argon ions and metal ions, under certain conditions, may acquire sufficient energy at the wafer surface to impinge upon the wafer with a sufficient momentum to dislodge material from the wafer surface causing etching (resputter). Atoms of the etched material may be permanently removed from the wafer, or may be redistributed from one position on the wafer to a different position. For example, material may be redistributed from the bottom of the via to the via sidewalls. Typically, etching and depositing processes are occurring simultaneously in the PVD chamber. Etching is performed by the inert gas ions and, in some cases, by metal ions, impinging on the wafer with a sufficient momentum to dislodge the exposed material, while deposition is effected by neutral metal atoms and, in some cases, by metal ions, being sputtered onto the wafer from the target. When an intrinsic etch rate E is greater than the intrinsic deposition rate D, a net etching process is occurring on the wafer surface. When the etch rate E is smaller than the deposition rate D, the process is characterized as a net deposition.

An etch rate to deposition rate ratio is often used to characterize the resputtering and deposition processes. At the E/D ratio of 1, no net deposition or etching is occurring. At the E/D ratio of 0, the process is entirely depositing. At E/D ratios of greater than 1 etching predominates, this being characteristic of resputter. The E/D ratio is not necessarily the same in different features of the wafer. For example, the E/D ratio in the field, in the trench, and in the via may have different values. For example, it is possible to have net deposition in the field region (E/D<1) and net etch at the via bottom (E/D>1), which is characteristic of conventional iPVD. In High Density Plasma metal fill, as it was described, unexpectedly, it is possible to have net deposition at, the trench bottom (E/D<1), and net etch on the field (E/D>1). The resputtering process in general can be described as a process that provides an E/D>1 at least at one location on the wafer, e.g., at a via bottom, at the lowest lying feature on the wafer or in some cases in the feature having the highest aspect ratio. The fact that a net deposition is occurring at a different location on the wafer, e.g., in the field, does not change the fact that resputtering is performed. An E/D ratio can be modulated by modulating the process parameters, such as the DC power applied to the target and the RF power applied to the wafer. The intrinsic deposition rate D is typically increased as the DC power to the target increases, because larger amounts of metal species are being sputtered from the target. An intrinsic etch rate E is typically increased as the RF power at the wafer increases, since it results in higher energy of inert gas ions and/or metal ions impinging on the wafer. Therefore E/D ratio can be increased by increasing the RF(wafer)/DC(target) power ratio. In High Density Plasma Metal fill, intrinsic etch rate and deposition rates may be balanced by modulating plasma density (e.g., through modulation of magnetic field strength) and ion energy (e.g., by modulating RF power applied to the wafer).

As described net etching and net deposition can be performed in one process chamber and can be controlled by process parameters such as power levels applied to the wafer and the target, pressure in the process chamber, strength of magnetic fields, etc.

In a conventional PVD and even iPVD system, metal deposition is accomplished primarily by neutral metal atoms, which are sputtered from the negatively biased metal target after the target is bombarded with inert gas ions. For example, $Ar^+$ ions impinging on a copper target will cause sputtering of neutral copper atoms from the target onto the wafer disposed below the target. While copper atoms sputtered from the target may be subsequently ionized in a plasma in the proximity of the target, majority of them will return back to the target following electrical field in that area. Metal ions which escape this field typically lose their charge through the charge exchange collisions with the gas atoms and do not reach the proximity of the wafer. Therefore, in a conventional system the wafer typically experiences a flux of metal characterized by a relatively low fractional ionization. Fractional ionization of metal as used herein refers to a ratio of ionized metal to the total number of metal species (neutral metal atoms and ions) in the proximity of the wafer (e.g., within about 5 mm of the wafer). In a conventional iPVD system fractional ionization of metal typically does not exceed 30%. The metal flux experienced by the wafer in a conventional iPVD has little directionality due to a large fraction of non-directional neutral metal atoms.

Figure 2B:
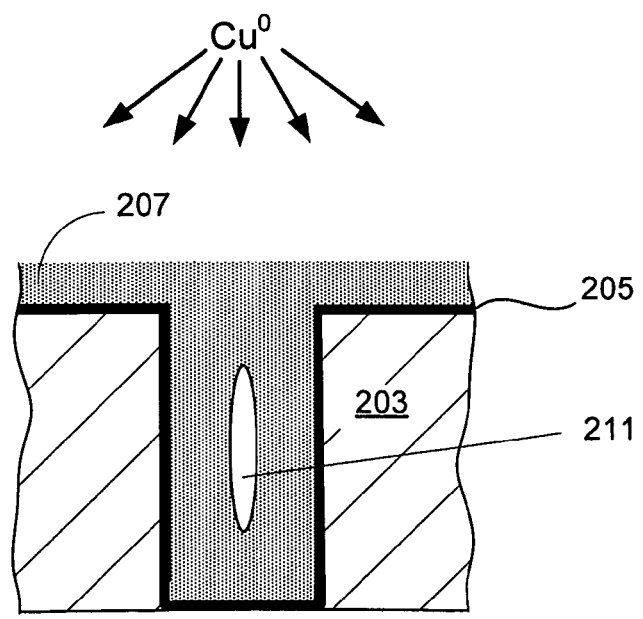

Deposition of copper in a conventional iPVD system is illustrated in FIGS. 2A and 2B. FIG. 2A shows a cross-sectional depiction of a trench 201 formed in a layer of dielectric 203 and lined with a layer of diffusion barrier material

205. A flux of copper consisting essentially of neutral copper atoms is being sputtered onto the substrate from a target. Because neutral copper atoms exhibit a wide angle distribution when they arrive at the substrate surface, a larger amount of copper is deposited onto the field region than onto the trench bottom. As a result, the copper layer 207 will rapidly build up overhangs 209 at the opening of the trench long before the trench is filled with copper. Referring to FIG. 2B, the structure resulting from an attempted PVD copper fill by conventional iPVD is shown. When large amounts of copper are deposited, the overhangs close at the top of the feature, before the feature is filled. Such pinch-off results in a structure having a void 211 within the copper-filled trench.

Because of this behavior, it was generally believed that PVD will not be a suitable method for metal fill in relatively narrow recessed features. Further, it was believed that PVD inherently deposits larger amounts of material in higher-lying features (e.g., on the field region) as compared to the lower lying features (e.g., trench bottoms and via bottoms).

As it will be shown, PVD can be successfully used for metal fill in recessed features with widths of less than about 300 nm, e.g., less than about 200 nm by using either the High Density Plasma Metal Fill or ALP Metal Fill approaches. Further, High Density Plasma Metal Fill can deposit metal within the recessed features at a higher rate than on the field region. Even more remarkably, High Density Plasma Metal Fill can deposit metal within the recessed features while simultaneously removing material from the field region.

High Density Plasma Metal Fill

It was discovered that recessed features could be filled with metal without forming substantial overhangs (e.g., overhangs resulting in pinch-off) by using a high density plasma for deposition. The method makes use of plasma characterized by high fractional ionization of metal in the proximity of the wafer substrate. Plasmas with fractional ionization of metal of at least about 50%, preferably at least about 80%, e.g., at least about 99% in the proximity of the substrate (e.g., within about 5 mm of the substrate) are used. Remarkably, plasma characterized by high fractional metal ionization shows an opposite deposition selectivity from a conventionally used plasma which is rich in neutral metal atoms. Depending on particular plasma parameters, PVD metal fill with high density plasma may be conducted according to the following three embodiments.

Figure 3A:
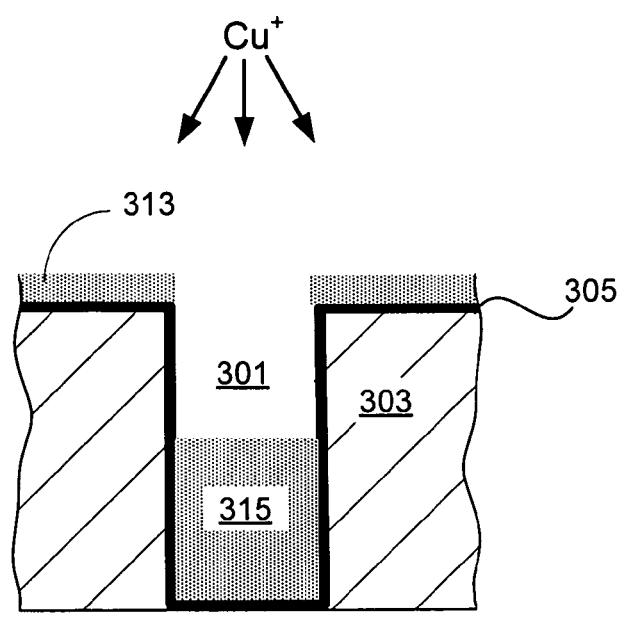
FIG. 3A shows a cross-sectional depiction of a substrate undergoing High Density Plasma Metal Fill. In accordance with this embodiment, metal is deposited at the trench bottom at a greater rate than on the field, referring to net deposition rates.

In the first embodiment, metal is deposited both within the recessed feature and on the field, such that the net deposition rate at the feature bottom is greater than the net deposition rate on the field. This embodiment is illustrated in FIG. 3A, where a cross-sectional depiction of a partially fabricated substrate undergoing deposition is shown. FIG. 3A shows a cross-sectional depiction of a trench 301 formed in a layer of dielectric 303 and lined with a layer of diffusion barrier material 305. A flux of copper consisting essentially of positively charged copper ions is being sputtered onto the substrate from a copper target. Unlike neutral copper atoms, ionized copper shows a more narrow angle distribution with a large fraction of ions arriving at a 90° angle to the wafer. This improves bottom coverage and reduces overhang. Further, copper ions have high mobility, and may migrate on the substrate surface until they arrive to the point of lowest energy, typically at the recess bottom. Further, copper ions as they arrive to the wafer may have sufficient energy to serve as a plasma etching species as they impinge onto the substrate and resputter (etch) material from the substrate. Therefore, copper may be simultaneously deposited and etched from the substrate, with a certain E/D ratio. In the embodiment illustrated in FIG. 3A, E/D ratio is less than 1 both on the field and at the recess bottom, that is net copper deposition is occurring at both surfaces. However, due to the factors mentioned above deposition on the field is slower, than within the recess, that is E/D at the trench bottom is smaller than in the field. Therefore, the trench may be filled before substantial overhangs are formed at the trench openings. FIG. 3A shows a partially filled trench with a layer of copper 313 residing on the field region and a layer of copper 315 residing on the trench bottom.

Figure 3B:
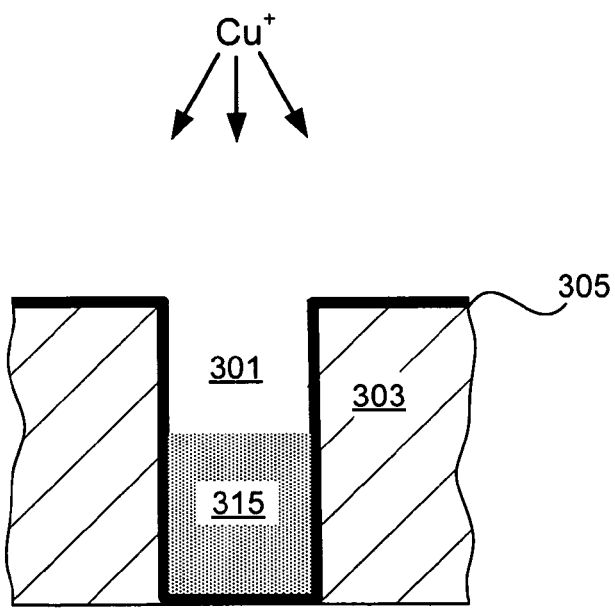
FIG. 3B shows a cross-sectional depiction of a substrate undergoing High Density Plasma Metal Fill. In accordance with this embodiment, metal is deposited at the trench bottom, while no net deposition nor net etching is observed in the field.

In the second embodiment, metal is deposited within the recessed feature while no net deposition or etching occurs in the field region. This is illustrated in FIG. 3B, where copper fill 315 resides within the trench, while no copper overburden is formed on the field region, and the diffusion barrier layer 203 remains exposed. In this case E/D ratio is less than 1 at the trench bottom, and is about 1 in the field region.

Figure 3C:
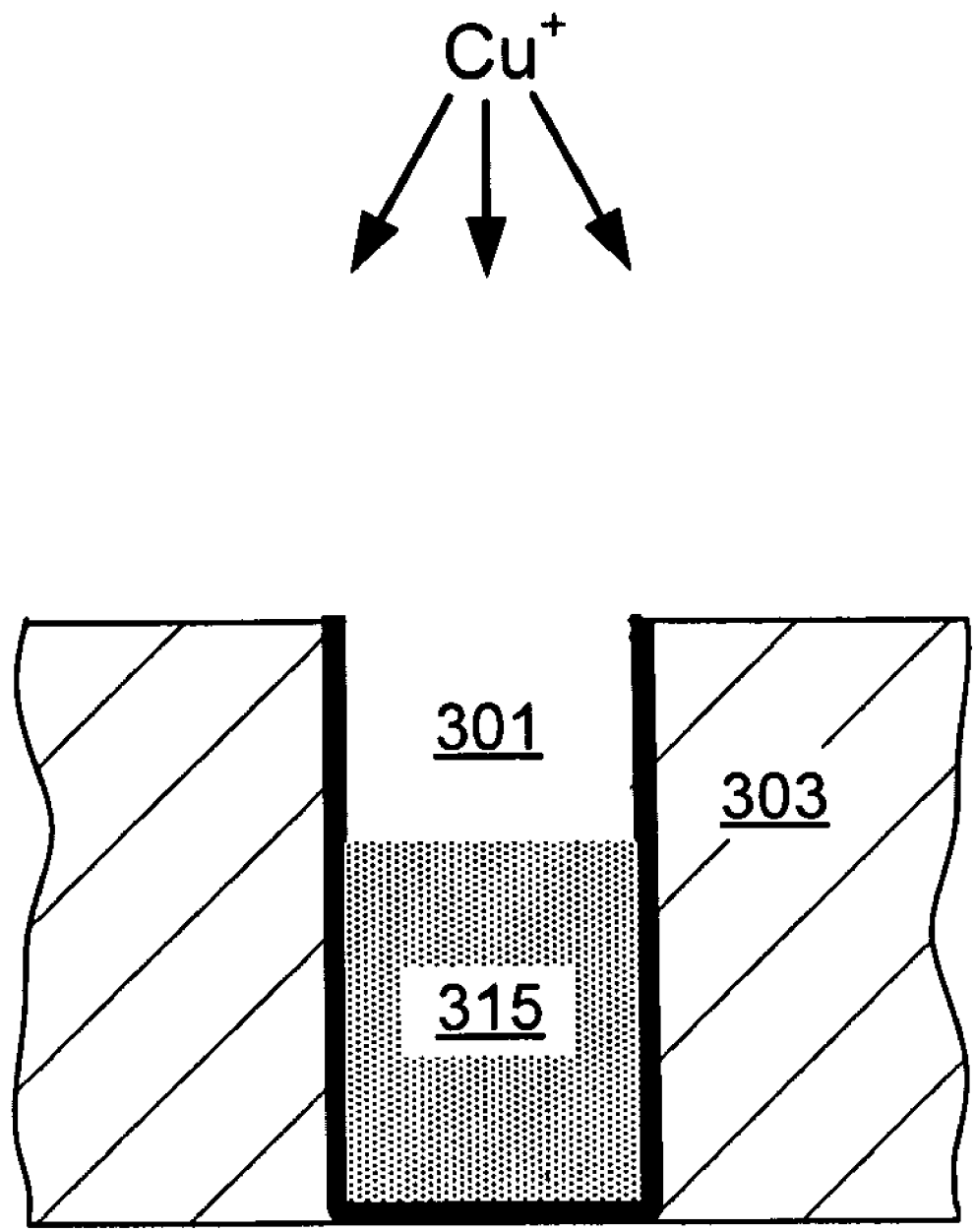
FIG. 3C shows a cross-sectional depiction of a substrate undergoing High Density Plasma Metal Fill. In accordance with this embodiment, metal is deposited at the trench bottom, while diffusion barrier material is simultaneously etched from the field region.

In the third embodiment, metal is deposited within the recessed feature while material is simultaneously removed (net etched) from the field region. This is illustrated in FIG. 3C, where the trench 301 is partially filled with copper layer 315, while diffusion barrier material is completely removed from the field exposing the dielectric layer 307. In this case E/D ratio is less than one at the trench bottom but is greater than one in the field region.

The net deposition rates of at least about 40 Å/second at the trench bottom can be achieved by this method. When etching of diffusion barrier material is occurring in the field simultaneously with recess fill, net etch rates of at least about 1 Å/second in the field can be achieved. For example a 400 nm deep trench can be filled in 100 seconds, while within the same time a 100 Å thick diffusion barrier material may be simultaneously removed from the field region.

It is understood that provided methods can be used to completely or partially fill the recessed features. In some embodiments at least about 20% of the recessed feature volume is filled from the bottom up. In other embodiments, at least about 80% of recess volume is filled, or the entire feature is completely filled with metal. In some embodiments the features are partially filled, e.g., to at least about 80% by volume, and the substrate is then subsequently planarized (e.g., by CMP) to remove any unwanted diffusion barrier and dielectric to the position that makes the level of the dielectric field substantially coplanar with the level of metal fill.

The metal fill is possible with the use of high density plasma characterized by high fractional ionization of metal, due to high mobility of metal ions, high directionality of metal flux, and due to an etching component which removes material from the field region. It is noted that while, in some embodiments mobility of copper ions may be further increased by e.g., using high substrate temperature, in general such substrate temperature increase is not required. For example, some conventional methods attempted PVD copper fill using PVD copper nucleation at low substrate temperature followed by deposition of bulk PVD copper at a higher temperature in order to maximize copper mobility on the substrate. While the described method may also follow this multi-temperature process, in some embodiments, in general the temperature change is not required, and the recesses may be filled, in some embodiments by maintaining the substrate at substantially the same temperature, e.g., at a temperature that does not fluctuate more than about 20° C. during deposition process. In general, any substrate temperature in the range of between about −50° C.-400° C. can be used. In a specific example copper is deposited while the substrate is maintained at a temperature of about −40° C.

Figure 4:
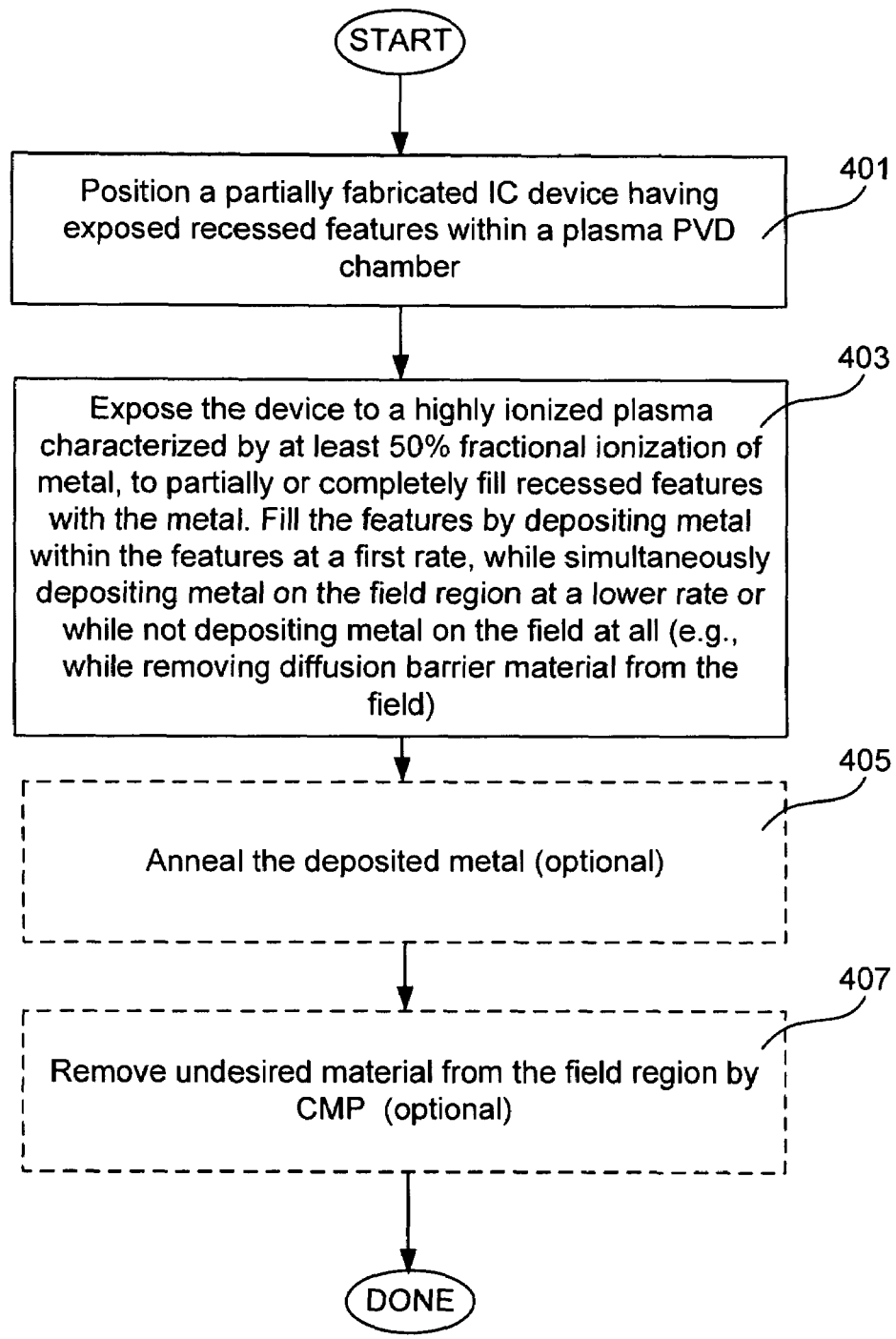
FIG. 4 presents a process flow diagram for High Density Plasma Metal Fill in accordance with an embodiment described herein.

An example process flow diagram for High Density Plasma Metal Fill is shown in FIG. 4. The process starts by operation 401 in which a partially fabricated device is positioned within the plasma PVD chamber. A variety of PVD chambers configured for generation of plasma may be used. Preferably, the PVD apparatus includes a magnetron capable of generating strong magnetic field and confining plasma. High magnetic confinement increases plasma density and leads to higher fractional ionization of metal at the wafer. PVD chambers containing three-dimensional targets, such as hollow cathode magnetron (HCM) and PVD chambers containing planar metal targets may be used. In some embodiments, metal may be sputtered from a coil, e.g., a coil supplying RF power to the plasma through capacitive or inductive coupling may be used.

An example substrate for metal deposition is illustrated in FIG. 1A. The substrate may include a layer of dielectric with a pattern of vias and trenches lined with a thin film of diffusion barrier material, such as Ta/TaN$_x$ or Ti/TiN$_x$ bi-layer. The substrate is typically degassed prior to entering the PVD deposition chamber. Degassing may be performed prior to diffusion barrier deposition or immediately prior to metal fill, for example, by heating the substrate to a temperature of between about 200-400° C., at a pressure of between about 5-200 Torr in the presence of an inert gas such as helium or argon. In some embodiments, the substrate is transferred to the copper PVD chamber directly from a tantalum or titanium PVD chamber without exposure to ambient atmosphere.

After the substrate is positioned within the chamber, in next operation 403, metal is deposited into the recessed features of the substrate at a first net deposition rate while metal is deposited simultaneously in the field at a lower rate or is not deposited in the field at all (e.g., diffusion barrier material is etched from the field). The three embodiments including different deposition modes have been described in detail with the reference to FIGS. 3A-3C. In High Density Plasma Metal Fill, plasma is ignited and the substrate is exposed to highly ionized plasma characterized by at least about 50% fractional ionization of metal. Preferably at least about 80% of metal should be ionized in the proximity of the wafer. In one embodiment, at least about 99% of metal is ionized. The plasma may also contain inert gas in neutral and ionic form. The presence of inert gas, however, is not required. For example, in some embodiments inert gas, e.g., argon, is flown only when the plasma is ignited. The flow of gas is then stopped, and a plasma containing essentially only metal species is maintained. In other embodiments, argon may be flown during metal deposition, and the ratio of argon to metal species may reach unity. Argon flow during deposition may range from about 0 to about 100 sccm, preferably from about 0 to about 10 sccm. Pressure within the deposition chamber may range from about 0.005 to about 5 mTorr, preferably from about 0.005 to about 0.5 mTorr.

The necessary high plasma density and high fractional ionization of metal is created, in one embodiment, by using high magnetic field for plasma confinement. In one embodiment, high magnetic field is applied at the proximity of the target, thereby confining plasma at the target region (within about 1 cm from the target) to a density of at least about $10^{13}$ electrons/cm$^3$. For example, a magnetic field of at least about 0.1 Tesla may be used for confining plasma in a volume of less than about 1 m$^3$. In this example, the wafer resides at a distance from the target, and is exposed to a plasma having a somewhat lower plasma density, but which is still preferably greater than about $10^{12}$ electrons/cm$^3$. Such plasma density is sufficient, to produce the desired fractional ionization of metal.

An external RF bias may be optionally applied to the wafer. The bias will increase the negative DC bias which naturally exists on the wafer in the presence of plasma. The DC bias is measured relative to plasma potential. As RF wafer bias is increased, the energy of metal ions impacting the wafer is increased, thereby increasing the E rate (resputtering rate). It is, however important to control the energy of metal ions, to ensure that net deposition rather than net etching is occurring within the recesses. In one embodiment, the mean energy of ions impacting the wafer is kept below about 70 eV. Preferably, the wafer is kept at a potential of less than about 100 V relative to plasma potential. In one embodiment, this is accomplished by not applying any external RF bias to wafer pedestal at all. In other embodiments an RF bias at a power level of up to about 300 W may be applied to the wafer having a diameter of 300 mm. (up to about 0.4 W/cm$^2$ power density). A negative DC bias is applied to the metal target during deposition. DC bias is applied to the target in some embodiments at a power level of about 20-100 kW. It is, however, understood that the target power level depends on the size of a target and may vary for apparatuses of different sizes.

In one specific embodiment, copper is deposited in an HCM by maintaining the substrate at a substantially constant temperature of about −40° C. and exposing the substrate to a plasma having high fractional ionization of copper. The deposition involves generating and maintaining highly confined plasma in the proximity of the target. This is accomplished by applying high current levels to electromagnetic coils of the magnetron. Argon is supplied to the process chamber at a flow rate of about 2 sccm and pressure is maintained at about 0.05 mTorr. A negative DC bias is applied to copper target at a power level of about 70 kW.

Referring again to the process flow diagram shown in FIG. 4, after the recessed features are filled the process may follow to an annealing operation 407. Annealing is performed by heating the substrate to a temperature of between about 100-400° C. in order to change copper microstructure from a small grain to a more desirable large grain formation. Copper lines with large grain microstructure are characterized by lower resistivity as is desired. Remarkably, it was discovered that PVD copper fill obtained by exposing the substrate to highly ionized plasma as described above, is often has a self-annealed form, that is, a form with large grain microstructure. For example, grains having lengths equal to trench height (e.g., 400-600 nm) and widths of about 70-150 nm could be obtained. Therefore, for High Plasma Density Metal Fill process sequence, the annealing operation is optional, and may be performed if copper microstructure needs to be further improved.

After an optional anneal operation 405, the substrate may be planarized, e.g., by a CMP operation in an operation 407. Planarization methods are well known to those of skill in the art and will not be described in detail. It is noted that in some embodiments planarization may be performed to remove copper overburden and/or diffusion barrier material from the field region. In other embodiments, when recessed features are only partially filled (e.g., 80% filled), planarization may be also used to remove the dielectric and to bring the dielectric level to the same level with the metal fill.

In other embodiments, CMP operations may not be required at all, because the method can cleanly fill the trenches while removing all of diffusion barrier material from the field region and providing the planarized substrate such as shown in FIG. 1C after PVD fill. After the partially fabricated structure, such as shown in FIG. 1C is formed, the process may proceed further as depicted in FIGS. 1D-1F.

Atomic Layer Profiling (ALP) Metal Fill

In another approach, the recessed features are filled by PVD using an atomic layer profiling (ALP) method. Similarly to High Density Plasma Metal Fill, this method can be applied to filling relatively narrow features, e.g., features with widths of less than about 300 nm, less than about 200 nm, and, in many cases, less than about 100 nm. Features with aspect ratios of greater than about 2:1, e.g., greater than 3:1, and 4:1 may be filled by this method.

The ALP method overcomes the problem of overhang formation and pinch-off by performing a plurality of relatively short deposition and etch (resputter) operations.

According to one embodiment, each ALP cycle includes one net deposition operation and one net etch operation. As the cycles are repeated, the deposition and etch operations alternate. During deposition operation, the metal flux is directed from the PVD target (and/or from a coil) onto the substrate disposed below the target. During resputtering, the metal flux is primarily directed from the bottom of the recessed feature onto the sidewalls of the recessed feature (although a small portion of the flux may be derived from the target or the field region). As a result, the sidewalls of recessed features are exposed to alternating metal fluxes from substantially opposite directions, resulting in reduction of overhang size. Further, the etching operations, at least in some ALP cycles will etch overhang material to result in overhang clipping. By adjusting durations of depositing and etching operations, and by adjusting plasma conditions used in these operations, partial or complete metal fill of vias and trenches is achieved. Conveniently, all operations of ALP Metal Fill can be performed in one PVD chamber using a depositing plasma under one set of conditions for the depositing operation of the ALP cycle and using an etching (resputtering) plasma under a different set of conditions during the etching operation of the cycle. As a result, metal fill can be performed by modulating parameters, such as power levels applied to the target and wafer pedestal, without any changes to PVD hardware, or substrate transfer. Further, it is noted that ALP metal fill can be performed at a substantially constant substrate temperature. For example, the temperature at the substrate pedestal, in some embodiments, does not fluctuate more than about 25° C. throughout the entire ALP process. In some embodiments, the substrate is maintained at a temperature of between about 25-50° C. during metal fill. It is understood, however, that the ALP Metal Fill need not necessarily be performed exclusively in the PVD chamber. In some embodiments, at least some of net etching operations of the ALP Fill are performed in a process chamber not having a metal target. For example, at least some of the etching operations may be performed in a plasma pre-clean chamber. The pre-clean process chamber is configured for generation of plasma, (e.g., inductively coupled plasma) to produce energetic inert gas ions that can be used to resputter (etch) material from the substrate. Notably, in this configuration there is no metal flux derived from the target, because the pre-clean chamber does not contain a target.

Figure 5:
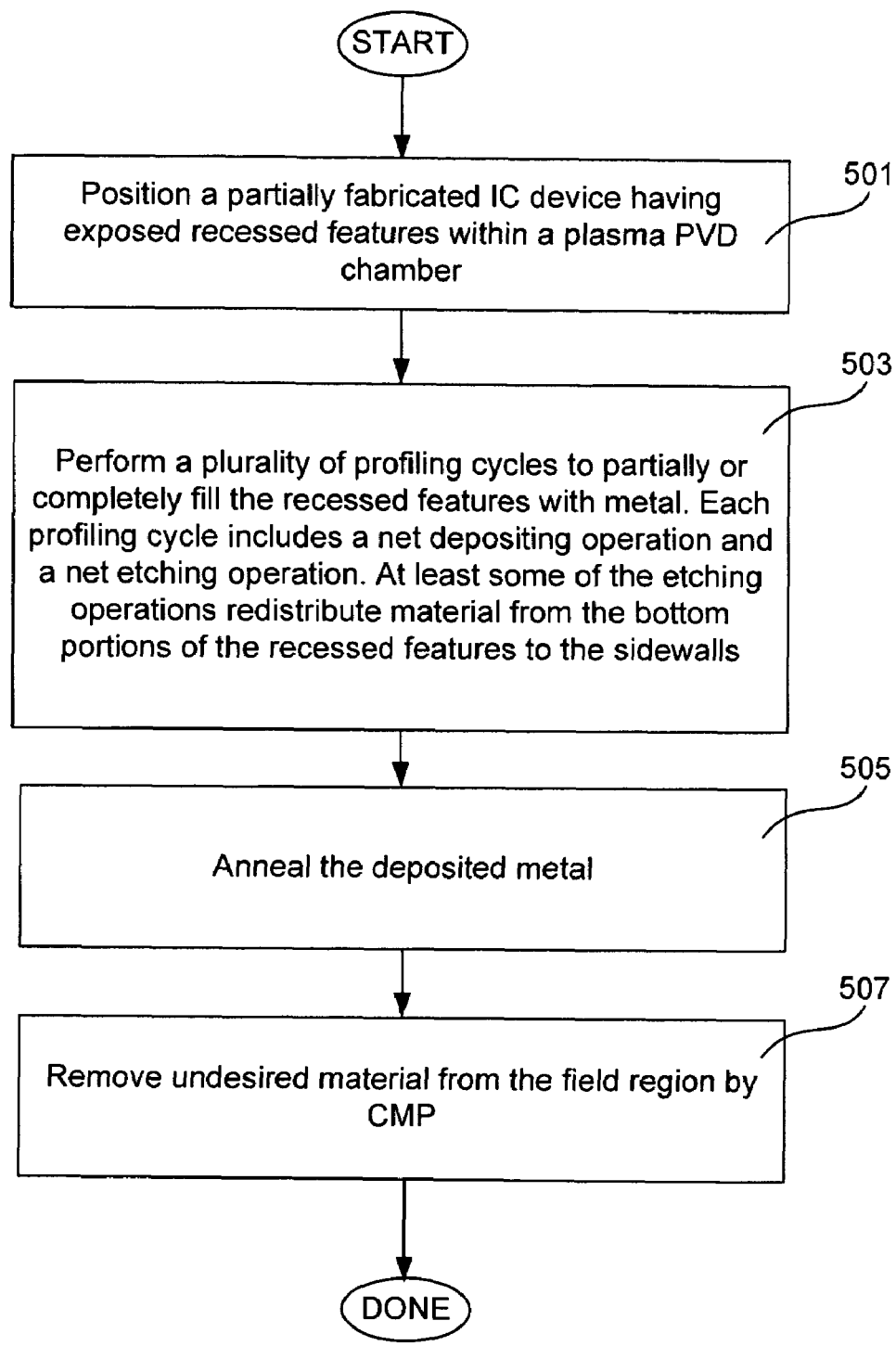
FIG. 5 presents a process flow diagram for Atomic Layer Profiling (ALP) Metal Fill in accordance with an embodiment described herein.

One embodiment of the ALP method will now be illustrated with the reference to the process flow diagram shown in FIG. 5. Schematic cross-sectional depictions of partially fabricated structures obtained during ALP metal fill are shown in FIGS. 6A-6G.

Referring to FIG. 5, the process starts in operation 501 by providing and positioning a partially fabricated IC device having exposed recessed features within a plasma PVD chamber. For example, a device having vias and trenches formed in a layer of dielectric, lined with a thin layer of diffusion barrier material is used for metal fill. An example of such device is shown in FIG. 1A. The substrate may be transferred to a copper PVD chamber from a diffusion barrier deposition chamber (e.g., a Ta or Ti PVD deposition chamber). The substrate, preferably is degassed prior to metal fill, as it was described previously. A variety of plasma PVD chambers are suitable for ALP Metal Fill. For example, an apparatus including a three-dimensional target (e.g., an HCM) or a planar magnetron may be used. The apparatus should be capable of producing a depositing and an etching (resputtering) plasma, and should be configured for rapid switching between the depositing and the resputtering modes. Alternatively, as it was described above, the depositing operations may be performed in a PVD chamber, while etching operations may be performed in a separate plasma pre-clean chamber. Preferably, the substrate is transferred between these two chambers without being exposed to an ambient atmosphere.

Both capacitively coupled plasma and inductively coupled plasmas (ICP) may be used for ALP Metal Fill. In one embodiment, the use of capacitively coupled plasma without an ICP source is preferred.

In one embodiment, the substrate having exposed recessed features is positioned on a wafer pedestal in a PVD chamber equipped with a copper target, to perform copper PVD fill. A variety of other metals, beyond copper, may be deposited by ALP metal fill, if desired. Examples of these metals include but are not limited to Al, Au, Ag, Ta, W, etc. Further, as it was mentioned various alloys of copper and alloys of aluminum may be deposited, e.g., by making use of alloy-containing targets.

In the next operation 503, a plurality of profiling cycles (ALP cycles) are performed to partially or completely fill the recessed features with the metal. Each profiling cycle includes a net depositing operation and a net etching operation. Net etching and net deposition are typically measured on the field region. It is also preferable that net etching and net deposition, occur at the recessed feature bottom. At least some of the etching operations of the profiling cycles will resputter metal from the bottom of the feature onto feature sidewalls. As these resputtering operations are repeated, the recessed feature is being filled from the sidewalls to the center.

After the recessed feature is filled, the structure is annealed in operation 505, to improve metal microstructure. Subsequently, in operation 507, undesired material (e.g., copper overburden and diffusion barrier material) is removed from the field by CMP. The planarized structure, such as structure shown in FIG. 1C is obtained as a result. The Damascene process may follow further, as depicted in FIGS. 1D-1F.

An ALP copper fill of a trench will be now illustrated with reference to structures shown in FIGS. 6A-6G. While in practice typically a large number of ALP cycles (3-300, preferably 10-100, more preferably 5-50 cycles) will be needed to fill a recessed feature, for illustration purposes metal fill with only 3 ALP cycles will be described with reference to FIGS. 6A-6G.

Figure 6A:
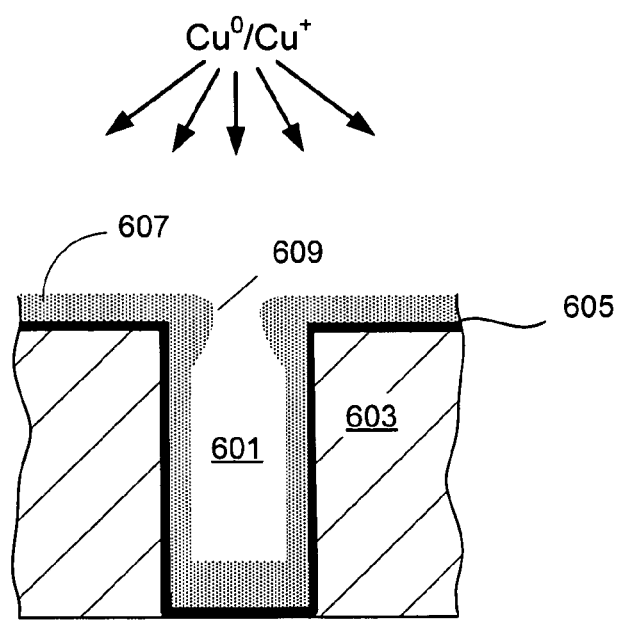
FIGS. 6A-6G show cross sectional depictions of device structures obtained during ALP Metal Fill process.

The process starts by depositing a thin layer of copper over the substrate surface. In one embodiment this is done by sputtering copper from the PVD target in a plasma PVD apparatus. The plasma can include metal (in both ionized and neutral form) as well as inert gas ions. The plasma parameters are adjusted such that E/D ratio is less than 1 both on the field and on the bottom of the trench. Therefore, copper is deposited both in the field and on the trench bottom. Sidewalls may also be covered in this operation, however, sidewall coverage may be thin and discontinuous. FIG. 6A illustrates a trench 601 formed in dielectric 603 lined with a thin diffusion barrier layer 605, undergoing copper deposition. A flux of ionized and neutral copper is directed onto the substrate from the target disposed above the substrate to deposit a layer of copper 607. In this embodiment, high fractional ionization of metal is not required, and copper may be deposited under conventional PVD conditions, e.g., predominantly by neutral copper atoms. As is typical for conventional PVD fill, overhangs 609 start to form. The first depositing operation, however, is typically relatively short and does not allow build-up of substantial overhangs. The first depositing operation serves to provide copper coverage at the bottom of the trench, which will serve as a source of copper flux in the following resputtering operation.

Figure 6B:
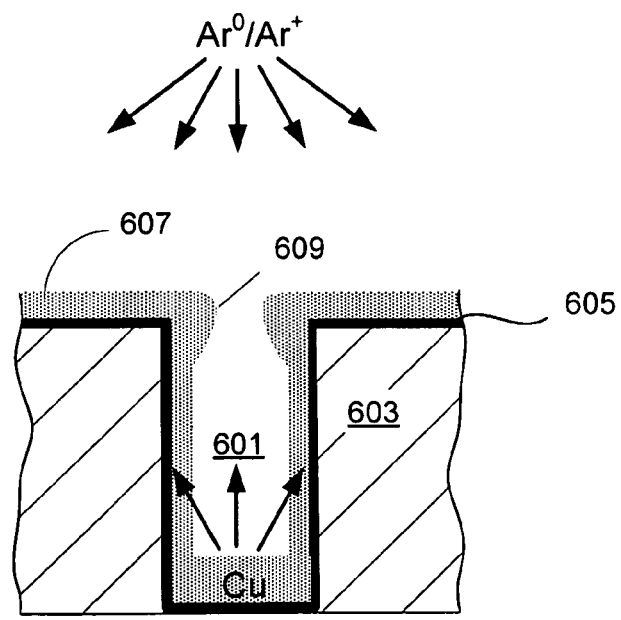

After copper has been deposited onto the trench bottom to a certain thickness, a resputtering operation is performed. During resputtering, energetic ions (preferably inert gas ions, such as argon ions) impinge onto exposed copper layer, and etch copper from both the trench bottom and the field region. The copper metal etched from the trench bottom is preferably redistributed from the trench bottom onto the trench sidewalls, as shown in FIG. 6B, where the substrate undergoing resputtering is illustrated. It can be seen that copper flux during resputtering is directed onto the sidewalls from below. Preferably, copper flux directed from the target is minimized during resputtering operation. It is understood that during resputter, the plasma need not necessarily be composed exclusively of gas species, and a certain fraction of metal species sputtered from the target may be present when the resputtering process is performed in a PVD chamber. However, in many embodiments, it is desirable to minimize the amount of metal sputtered from the target, by, e.g., applying lower power to the target as compared to the target power used in deposition. In many embodiments, E/D ratios (as measured in the field region) of greater than about 1.5, even more preferably, greater than about 3 are preferred during resputtering operations. In some embodiments the net etching operation removes copper from the trench bottom at an etch rate of at least about 3 Å/second. In some embodiments, a net depositing operation of an ALP cycle deposits between about 50-600 Å of copper onto the field region, while subsequent etching operation etches at least about 40% of the deposited layer thickness (as measured in the field). In many embodiments the net etching operation of an ALP cycle removes between about 40-100% of copper layer thickness as measured in the field region.

Figure 6C:
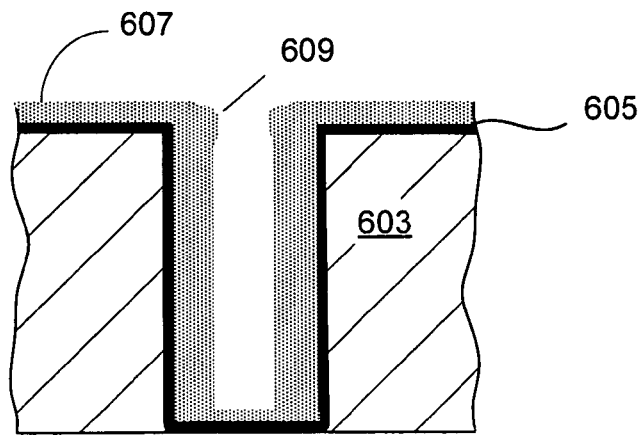

FIG. 6C shows a cross-sectional view of a substrate after resputtering has been performed. It can be seen that resputtering increases copper layer thickness on trench sidewalls, while reducing copper thickness both on the field region and on the trench bottom. It can be seen, that overhangs 609 are protruding to a lesser extent after resputtering has been performed. Overhangs are reduced in part because the sidewalls are exposed to copper fluxes from different directions, which results in increase of sidewall coverage and subsequent overhang decrerase. In addition, resputtering operation may partially etch copper from the overhangs (overhang clipping) effectively increasing the feature opening. Resputtering operation is preferably controlled such that no overetching at the trench bottom is occurring. While in some embodiments it may be acceptable to etch all copper deposited at the trench bottom, care should be taken in order to preserve the diffusion barrier layer at the bottom of the trench, particularly if the trench resides over a layer of dielectric. In vias residing exclusively over underlying copper lines (landed vias) overetching into diffusion barrier or into underlying copper may be acceptable in some embodiments.

Figure 6D:
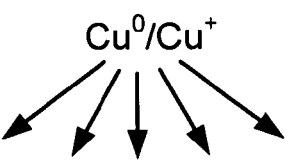
Figure 6D:
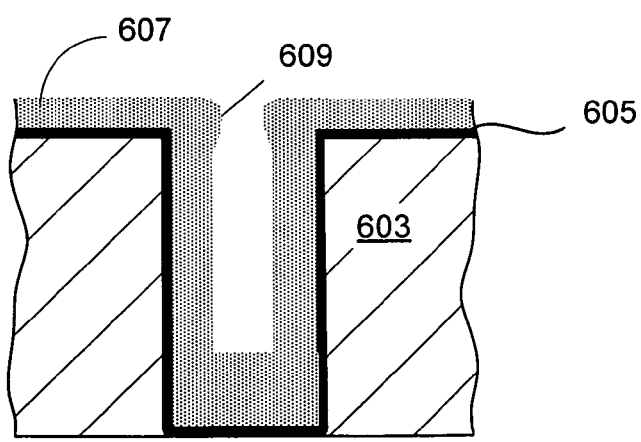
Figure 6E:
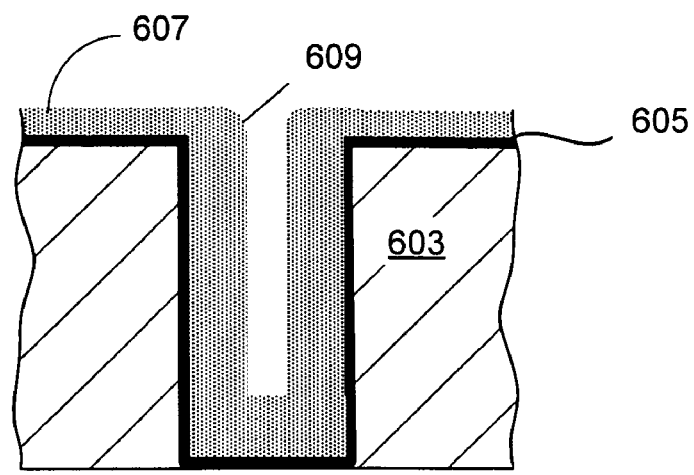
Figure 6F:
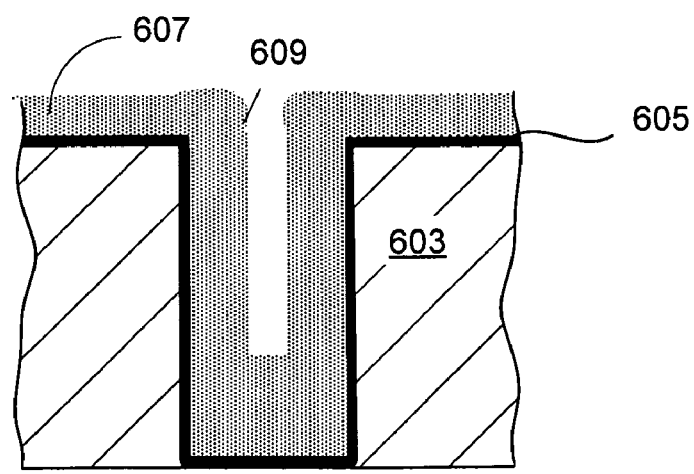
Figure 6G:
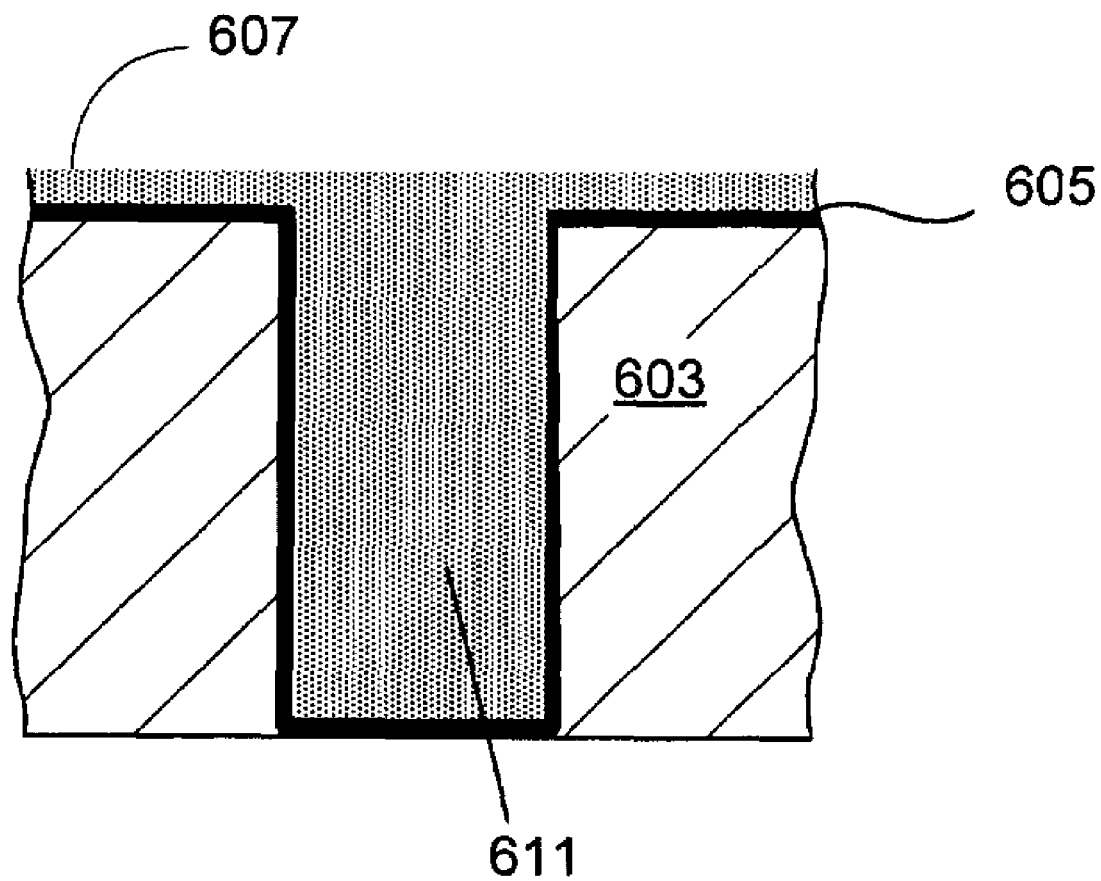

After the resputtering operation has been performed, a subsequent deposition operation follows and forms a structure shown in FIG. 6D, where it can be seen that thickness of copper layer at the trench bottom and on the field is increased. Next, an etching (resputtering) operation is performed forming a structure shown in FIG. 6E, where the thickness of copper layer on the sidewalls is further increased, and the overhangs are reduced. Next, deposition operation follows to form a structure shown in FIG. 6F, where the coverage at the trench bottom and in the field is increased. After that, another etching operation is performed to redistribute material from the trench bottom to the sidewalls, followed by a deposition operation to fill the trench and afford the structure shown in FIG. 6G.

In general, an ALP cycle may start either with a depositing (Dep) or an etching (Etch) operation. It is understood that ALP Metal Fill process sequence starts by depositing metal at the trench bottom. This first depositing operation may be considered a separate operation or a part of the first ALP cycle. For example, the sequence of operations depicted in FIGS. 6A-6G can be presented as Dep/Etch/Dep/Etch/Dep/Etch/Dep or as Dep/Cycle1/Cycle2/Cycle3 or as Cycle1/Cycle2/Cycle3/Dep. Generally, the ALP metal fill process may end with either a depositing or an etching operation.

Depositing and etching operations for different ALP cycles may be carried out under identical or different conditions. It is advantageous that by varying parameters in ALP cycles (such as power levels applied to the target and wafer pedestal, magnetic confinement, pressure, durations of the depositing and etching operations, etc.), the ALP Metal Fill process may be optimized to fill the recessed features while minimizing overhang formation and pinch-off.

For example, in some embodiments, the deposition conditions in the depositing operation of the first ALP cycle are different from deposition conditions employed in subsequent ALP cycles, which may in turn be different from deposition conditions of last ALP cycles.

Figure 7:
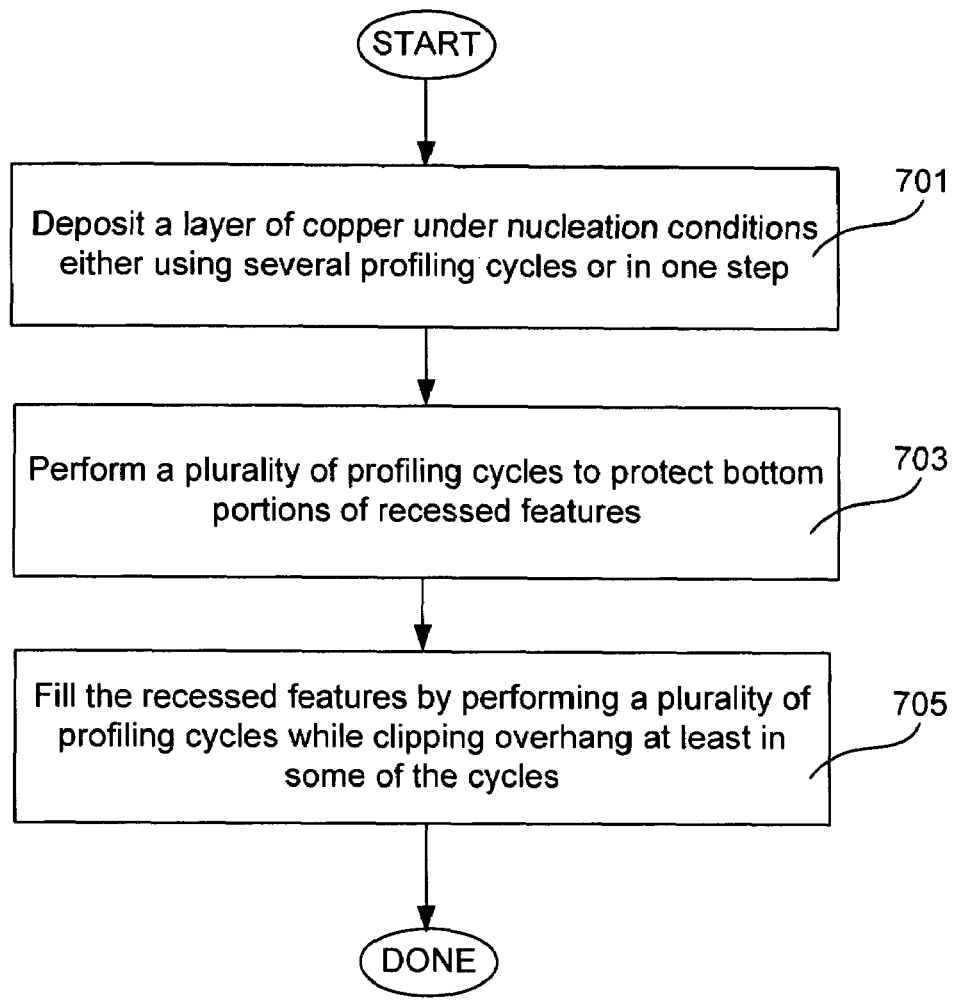
FIG. 7 presents a process flow diagram in accordance with one embodiment of ALP Metal Fill.

The process flow diagram shown in FIG. 7 illustrates a process in which different conditions are used in different ALP cycles, in order to achieve optimal fill. In this embodiment, the process starts in operation 701 to deposit a layer of copper under nucleation deposition conditions. This operation may be viewed as a separate operation or as a first depositing operation of a first ALP cycle. Nucleation is performed using a plasma characterized by a relatively high fractional ionization of copper, e.g., with a plasma having fractional copper ionization of greater than about 30%. In one embodiment, the nucleation plasma includes about 80% of inert gas species (ions or neutral atoms) and about 20% of copper species with the fractional copper ionization of about 50%. In some embodiments nucleation is performed by sputtering copper under following conditions: substrate temperature of between about −50-150° C., chamber pressure of about 0.005-0.6 mTorr, RF power applied to wafer pedestal of between about 0-300 W, DC target power of between about 20-100 kW and an argon flow rate of between about 0-10 sccm.

In a specific embodiment, nucleation is performed by sputtering copper onto the substrate under the following conditions: substrate temperature about −50° C., pressure of about 0.05 mTorr, no external RF power applied to wafer pedestal, DC target power of about 70 kW and an argon flow rate of about 2 sccm.

After nucleation layer of copper has been deposited, the deposition conditions in subsequent ALP cycles may use plasma with a lower fractional ionization of copper. This can be done by lowering the magnetic confinement of plasma in subsequent depositing operations, and by using a higher argon flow rate. For example, magnetic field strength at the target may be lowered by at least about 10%, preferably by at least about 25% (as compared to nucleation deposition conditions).

Referring again to the process flow diagram of FIG. 7, after the copper nucleation layer is formed, a plurality of profiling cycles is performed to protect bottom portions of recessed features. The objective of these cycles is to build a layer of copper at the trench bottom, in order to protect the trench bottom from overetching, which might inadvertently occur during aggressive resputtering. In protective ALP cycles an etching operation preferably removes less than about 70% of the copper layer thickness deposited in the prior depositing operation. For example, no more than 50% of the copper layer thickness may be removed by the etching operation, as measured in the field. In a specific example, each depositing operation of a protective ALP cycle deposits about 100 Å of copper on the field, while each etching operation removes about 50 Å of copper from the field. Therefore, each ALP cycle deposits a net of 50 Å of copper on the field. The thickness of the copper layer deposited at the trench bottom is typically between about 10-90% of the thickness of the copper layer deposited on the field depending on trench aspect ratio. In some embodiments, between about 1-10 protective ALP cycles are performed until the trench bottom is sufficiently covered. In subsequent ALP cycles, more aggressive etch-back operations may be used. For example, in subsequent ALP cycles at least about 70% of the deposited layer thickness (as measured in the field) is removed during etchback in each cycle.

As shown in operation 705, after the protective ALP cycles have been performed the process follows by performing ALP cycles to complete the filling of the trench. For at least some of the etching operations in these ALP cycles, the conditions may be adjusted such that etching reduces (clips) the overhangs.

In one embodiment the trench is filled by performing the following sequence. First, one nucleation ALP cycle, starting with a depositing operation is performed. The depositing operation of this cycle deposits 100 Å of copper under nucleation conditions. The following etching operation etches 50 Å of deposited copper layer, as measured in the field. Next, six protective ALP cycles are performed. Each cycle starts with a depositing operation which deposits 100 Å of copper under general deposition conditions and follows with an etching operation, which 50 Å of deposited copper. Next, fifty filling ALP cycles are performed. In each filling ALP cycle, the depositing operation deposits 100 Å of copper under general deposition conditions and the following etching operation etches 70 Å of copper.

In general, a variety of PVD conditions are suitable for PVD deposition and PVD etch operations. For the net deposition process the DC power can range from about 5 W/(cm$^2$ target) to 25 W/(cm$^2$ target), and, for the RF power, from about 0 W/(cm$^2$ substrate) to 0.5 W/(cm$^2$ substrate). PVD deposition is described in U.S. Pat. Nos. 6,905,959; 6,773, 571; and 6,642,146, which patents are hereby incorporated by reference in their entireties and for all purposes.

For the etchback (resputter) step the combination of DC power applied to the target and RF power applied to the wafer has to ensure the net material removal from the wafer. For example, for HCM modules having target areas of between about 1000-6000 cm$^2$, DC power should be in the range from 1 kW to 10 kW or as low as 0 for the pure etching. One of skill in the art will understand that this range depends on the target area, and can be different for smaller or bigger targets especially if the method is used with the different source/target design. The RF power may be between about 100 W to 3000 W for a typical substrate (e.g., a 300 mm wafer). This range depends on the wafer area and can be much greater for applications that deal with big substrates. In terms of power density (independent of the target area or substrate area), examples of suitable DC power ranges for the sputter etch operation are range from about 0 W/(cm$^2$ target) to 5 W/(cm$^2$ target) and for the RF power, from about 0.1 W/(cm$^2$ substrate) to 5 W/(cm$^2$ substrate).

In some embodiments resputtering is performed in a low-energy regime. This type of resputtering utilizes relatively low-energy ions as the resputtering species, and makes use of high density plasma. Under theses conditions, the resputtering plasma has a density of at least about $10^{10}$ electrons/cm$^3$ proximate to the substrate, and a mean ion energy of about 100-700 eV for the ions impinging onto the wafer. Preferably, argon-rich plasma is used for resputtering. For example, the plasma may contain at least about 80%, preferably at least about 90% of inert gas species. In one embodiment the plasma contains about 95% of Ar$^+$ ions and about 5% of Cu$^+$ ions. High density plasma low energy resputter can be performed using relatively low RF bias applied to the substrate in order to decrease ion energy. The plasma density in the proximity of the wafer can be increased with the use of an ion extractor, which will be described in greater detail in the apparatus section.

Suitable conditions for high plasma density low energy resputtering include: a substrate temperature in the range of between about −50-100° C., a pressure of between about 0.5-5 mTorr, RF power applied to the substrate pedestal of between about 200-1000 W, preferably less than about 500 W, DC target power of about 0.5-10 kW, and an argon flow rate of between about 10-200 sccm.

Typically, in an ALP cycle, switching from a depositing operation to an etching operation is performed by decreasing the DC Power applied to the target in order to reduce the copper flux from the target. Argon-rich plasma with at least about 9:1 argon/copper ratio is preferred during etch-back, in some embodiments. In some embodiments, the DC power applied to the target is reduced from about 50-70 kW during depositing operation to about 1-3 kW during resputter. Further, in some embodiments, resputtering is performed using a higher RF wafer bias. For example deposition may be performed without applying an external bias to the wafer. When switching from deposition to etching, the RF bias may be increased, e.g., to about 600 W. In addition, in many embodiments, argon flow rate is increased, while switching from deposition to resputter, in order to provide a more argon-rich plasma.

One skilled in the art will understand that many variations of ALP processes can be envisioned and practiced. The provided examples serve as illustrations and do not limit the scope of the invention. For example, in some embodiments it may be preferable to use gases other than argon for deposition and resputtering. Specifically, in some embodiments of ALP Metal Fill process it may be advantageous to use light ions (e.g., ions having atomic weight less than the weight of argon) to perform resputtering. Light gases, such as neon, and particularly helium, can be used in ALP etching operations to advantageously tailor distribution of angles of resputtered material, particularly of material resputtered at the feature opening. Further, the use of light gases may prevent overetching of diffusion barrier material at the feature openings or recess bottoms.

An alternative embodiment of an ALP Metal Fill process makes use of a different mechanism for an etching operation of ALP. In this embodiment, the etching operation primarily redistributes material from the portions of the substrate above the recess bottom to the recess bottom, and to bottom portions of the sidewalls. In this embodiment, the ALP cycle includes an etching operation which essentially resputters material from the field region and from the overhang portions into the recessed feature. Therefore, in this embodiment the etching operation provides a net etch of material from the field, but may not necessarily provide a net etch at the bottom of the recessed feature, that is, no net etch, or even net deposition may occur at the feature bottom during such operations. Such "field into the feature" resputter may be performed in a PVD chamber or in a plasma chamber without a metal target (e.g., a pre-clean chamber). In one embodiment, such etch-back may be performed by using high-pressure resputter. In this embodiment the inert gas (at a high pressure of, e.g., at least about 20 mTorr, or at about 40-80 mTorr) serves as an "ion reflector", which reflects resputtered material back onto the substrate, such that material would not be otherwise completely lost within the process chamber. The concept of "ion reflector" and high pressure resputter has been described in detail in the commonly-owned U.S. patent application Ser. No. 11/830,777 filed Jul. 30, 2007, naming R. Rozbicki as an inventor, which application is herein incorporated by reference in its entirety and for all purposes. While the high pressure resputter process has been described in the application primarily with reference to diffusion barrier layers, a similar process may be conducted to perform resputtering in ALP process flow in the context of metal fill (e.g., in a coper PVD chamber). It is understood, that other methods can be used to promote "field into the feature" resputter, and that the described embodiment is not limited to high pressure resputtering. For example, in some embodiments "field into the feature" resputtering may be promoted by using heavier ions in the resputtering process gas. Heavier ions tend to resputter materials at an angle that can be used to push resputtered material deeper into the recessed feature. Thus, process gases including ions that are heavier than argon, e.g., krypton or xenon may be found useful to perform "field into the feature" resputter. Understandably, resputtering with heavy ions may be used in conjunction with high-pressure resputtering in order to increase the effectiveness of the process.

Apparatus

A number of PVD process chambers can be used for High Density Plasma Metal Fill and for ALP Metal Fill. For example, PVD process chambers that include a hollow cathode magnetron or a planar magnetron can be used. Further, as it was mentioned, in some embodiments both etching and depositing operations of ALP Metal Fill are conducted in a PVD process chamber. In other embodiments, at least some of the etching operations of ALP method may be conducted in a plasma process chamber that does not contain a metal target (e.g. a process chamber that is also used for plasma pre-clean). The depositing operations are typically conducted in a PVD process chamber equipped with a metal target and/or RF-powered coil.

Figure 8:
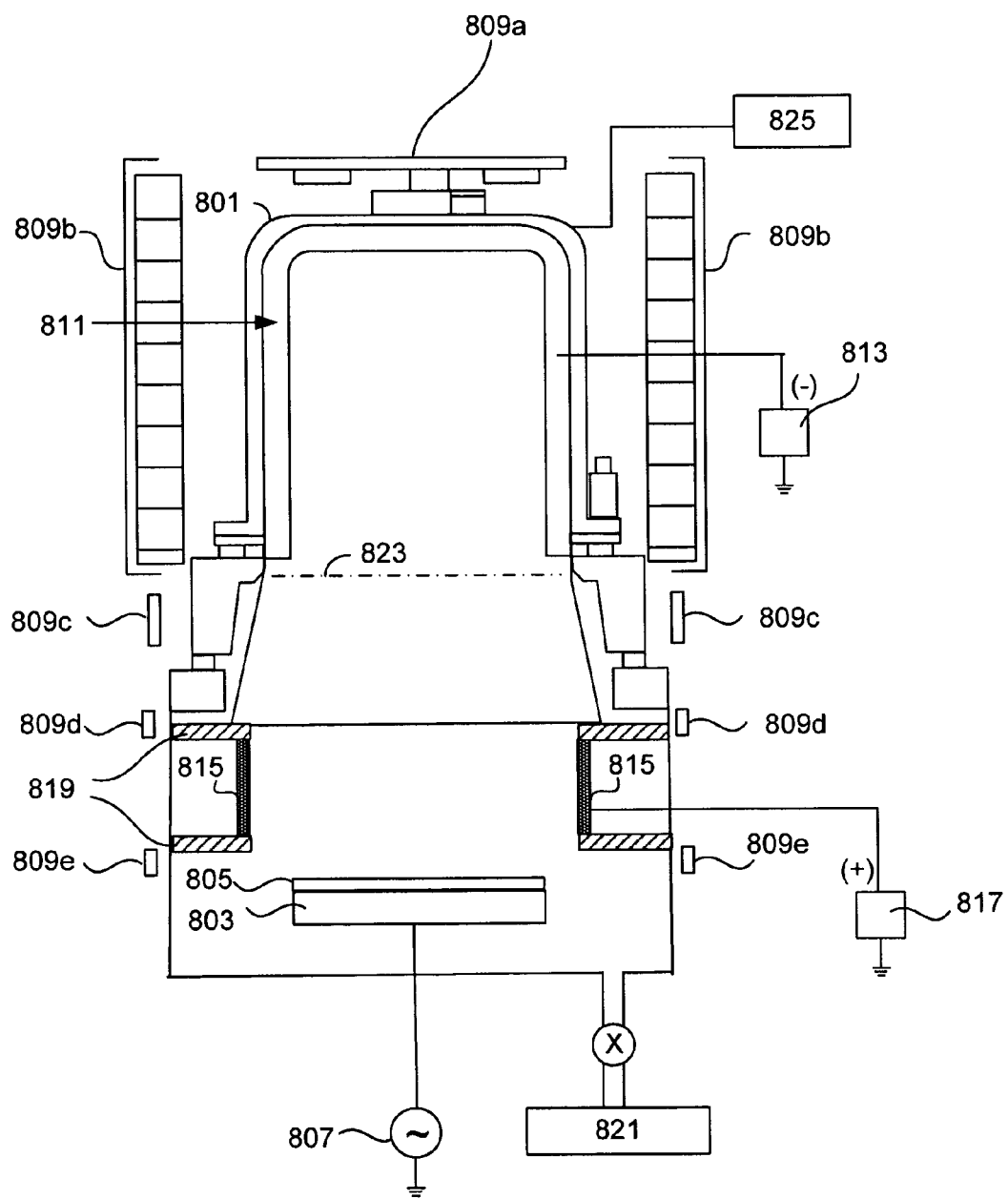
FIG. 8 is a cross sectional depiction of the hollow cathode magnetron (HCM) apparatus suitable for practicing methods described herein.

FIG. 8 presents a cross sectional view of one type of an HCM sputtering apparatus in accordance with one embodiment of the invention. The HCM apparatus has two main components, the source 801, in which a plasma is created and maintained, and the RF bias electrostatic chuck (ESC) pedestal 803, which secures the wafer 805 and applies a negative RF bias on the wafer if needed. A separate RF power supply 807 is electrically connected to the wafer pedestal and provides the RF bias to the pedestal 803 when required, leading to generation of a negative DC bias at the wafer, upon interaction of the biased wafer with the plasma. RF bias may be applied both during deposition and resputtering. In many embodiments deposition is performed without applying an RF bias to the wafer. Resputtering typically requires application of external RF bias in order to increase the energy of ions impinging on the wafer. An RF bias power of between about 100-3,000 W is used for resputtering on a 300 mm wafer, in many embodiments. In those embodiments which employ low energy resputter, RF power of less than about 2,000 W, preferably less than about 600 W is employed. Energy of impacting ions is primarily controlled by the bias at the wafer, with lower bias resulting in lower ion energy. The ESC pedestal 803 also serves to provide the temperature control for the wafer 805. The temperature at the wafer pedestal can range from about −50 to 600° C., preferably between about 0 and 150° C.

In this example, the HCM contains a top rotating magnet 809a, several annular side electromagnets 809b-809e, circumferentially positioned around the process chamber, and a sputter target 811, operated at a negative DC bias. The sputter target is electrically connected to the DC target power supply 813. A DC bias power of between about 1-100 kW is typically applied to the target. The density of plasma in the apparatus can be controlled by controlling magnetic confinement of plasma within the hollow target portion of the HCM and in the vicinity of the wafer. In some embodiments, highly magnetically confined plasma is generated within an HCM by applying an intense magnetic field at the target portion of an apparatus. In one embodiment, High Density Plasma Metal Fill involves passing high currents through electromagnetic coils 809b. In a specific example currents greater than about __12 A are passed through at least some coils to generate a magnetic field of at least about 0.1 Tesla in the vicinity of the target, and to form a plasma having a density of at least about $10^{13}$ electrons/cm$^3$ within the target region. It is understood that while ALP Metal Fill also employs magnetically confined plasma, in this approach the use of ultra-high magnetic fields is not required.

One or several shields may be positioned within the chamber next to the chamber sidewalls, to protect the sidewalls from the sputtered material. In the provided configuration, the shield 815 is positively biased and serves as an "ion extractor", configured to increase plasma density in the proximity of the wafer by transferring ions from a high plasma density region to the wafer region. The ion extractor 615 is electrically connected to a separate DC power supply 817 and is configured to accept a positive bias from the power supply 817. A positive bias of at of at least about 30 V, preferably between about 50 and about 300 V, and even more preferably between about 100 V and about 150 V is applied to the ion extractor. In one implementation, a power ranging from about 10 and 600 W is applied to the ion extractor. Ion extractor may be used during depositing and resputtering operations in an ALP Metal Fill approach. The ion extractor is particularly useful when the etching operations of ALP cycles are performed in high plasma density low energy regime. In the High Density Plasma Metal Fill approach, the high density plasma is typically generated with the use of high magnetic fields, and the use of ion extractor is not necessary in many embodiments. However, in some embodiments of High Density Plasma Metal Fill, the ion extractor may be used to increase the plasma density and fractional ionization of metal in the proximity of the wafer.

The ion extractor shield 815 is electrically isolated from the process chamber sidewalls with two insulating ceramic rings 819. In the provided example, the shield 615 is an aluminum member having a hollow cylindrical shape, which is located about 8 cm above the wafer pedestal 803, and about 16 cm below the target 811. Note, that since the ion extractor is positively biased during operation of an HCM, its material is not substantially sputtered onto the wafer surface. Therefore, the ion extractor can be made of a variety of conductive materials, which may be different from the material being deposited or resputtered on the wafer. For example, an aluminum ion extractor can be used during copper resputter. It is understood that the apparatus configuration having an ion extractor is shown as an example configuration and that the described methods are not limited to such configuration. The ALP and High Density Metal Fill methods in many embodiments are performed without the use of ion extractor.

The cathode target 811 generally has a hollow cup-like shape so that plasma formed in the source can be concentrated within this hollow region. The cathode target 811 also serves as a sputter target and is, therefore, made of a metal material which is to be deposited onto a substrate. For example, a copper target is used for copper fill and aluminum target is used for aluminum fill. A target made of an alloy can be used to fill the features with alloys.

An inert gas, such as argon, is introduced through a gas inlet (not shown to preserve clarity) into the process chamber from the sides, just below the ion extractor 815. The pump 821 is positioned to evacuate or partially evacuate the process chamber. The control of pressure in the process chamber can be achieved by using a combination of gas flow rate adjustments and pumping speed adjustments, making use of, for example, a throttle valve or a baffle plate. Typically the pressure ranges between about 0.001 mTorr to about 100 mTorr during the deposition and resputtering processes.

An intense magnetic field is produced by electromagnets 609b within the cathode target region. The electrons emitted from the cathode are confined by the crossing electrical and magnetic fields within the hollow portion of the cathode target 811 to form a region of high plasma density within the hollow cathode. Additional electromagnets 809c-809e are arranged downstream of the cathode target and are used to shape and further confine the plasma at the elevations closer to the wafer pedestal 803.

In the described embodiment, the confinement of plasma in the region of high plasma density within the hollow target 811, is further increased by the presence of a separatrix 823. Separatrix 823 is an imaginary line associated with the distribution of the magnetic field lines within the chamber, which divides the magnetic field confining the plasma within the hollow target region from the magnetic field downstream in the proximity of the wafer. The separatrix 823 includes a region of null magnetic field residing between the target 811 and the wafer 805, which allows for transfer of ions from the region of plasma confined at the target to the proximity of the wafer. Typically, in an HCM, the separatrix resides in the proximity of the target opening, but can be moved upward or downward in the chamber by the modulation of magnetic field polarity of individual magnets. The separatrix can be formed by using magnetic fields of opposite polarities to confine the upper and lower regions of plasma. The separatrix is desired for maintaining a high plasma density in the plasma region adjacent to the target, since it confines electrons and positively charged ions within this region. It is understood that in many embodiments the presence of a speratrix may not be necessary.

In certain embodiments, a system controller 825 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the apparatus. The system controller executes system control software including sets of instructions for controlling the timing, mixture of gases, chamber pressure, chamber temperature, wafer temperature, RF power levels at the wafer, DC power levels at the target, polarity of electromagnetic coils 809a-e, power levels and current levels applied to the coils, power levels and a bias, applied to the ion extractor 815, wafer chuck or susceptor position, and other parameters of a particular process. Other computer programs stored on memory devices associated with the controller may be employed in some embodiments.

Typically there will be a user interface associated with controller 825. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, magnetic field within the chamber, plasma density within the chamber, process gas composition and flow rates, temperature, pressure, plasma conditions such as RF and DC power levels, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck, DC power levels applied to the target, DC or RF power levels applied to the ion extractor, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing High Density Plasma Metal Fill or ALP Metal Fill according to methods described above. For example, the instructions can specify the parameters needed to produce a plasma characterized by high fractional ionization of metal. Further the instructions may specify ALP parameters, such as parameters for performing depositing and resputtering operations, durations of these operations, the number of ALP cycles to be performed, etc. For example, instructions may specify parameters for performing different types of ALP cycles, e.g., parameter for performing nucleation ALP cycle or cycles, followed by protection ALP cycles, followed by filling ALP cycles may be specified. The instructions may also specify parameters for performing low energy resputtering.

Figure 9:
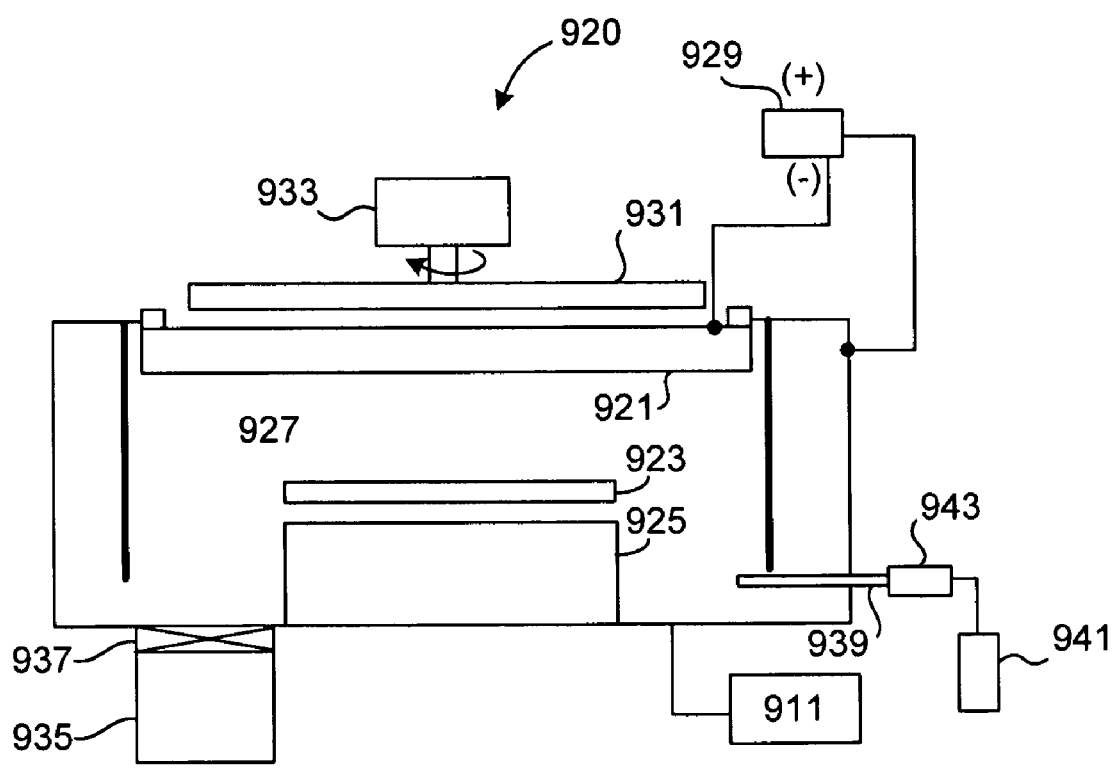
FIG. 9 is a cross sectional depiction of a planar magnetron apparatus suitable for practicing methods described herein.

According to other embodiments of the invention, the High Density Plasma Metal Fill and ALP Metal Fill can be performed using a planar magnetron. FIG. 9 shows a schematic representation of an example planar magnetron 920. Target 921, a circular, planar block of material to be deposited, is spaced from the wafer 923, which is mounted on a heating stage 925 in chamber 927. A DC power supply 929 is used to apply a DC field to target 921, establishing a plasma in the chamber below target 921. A circular magnet 931 mounted above the target is rotated by motor 933 setting up a magnetic field extending through target 921 into the region between the target 921 and wafer 923. A cryopump 935 connected to chamber 927 via valve 937 is used to evacuate the chamber. Process gas injector 939 is connected to process gas supply 941 via mass flow controller 943. A sputtering gas is introduced into chamber 927 via injectors 939. A controller 911 can include program instructions for performing High Density Plasma Metal Fill and ALP Metal Fill methods as was described above. It is understood that the structure of module 920 is exemplary only. The methods of present invention may be practiced in other types of planar magnetrons, such as ones having ICP sources. It is noted that the methods of present invention do not require the presence of an RF-biased coil within the apparatus, although they can be practiced in an apparatus equipped with such coil.

Experimental

High Density Plasma Metal Fill

Figure 10:
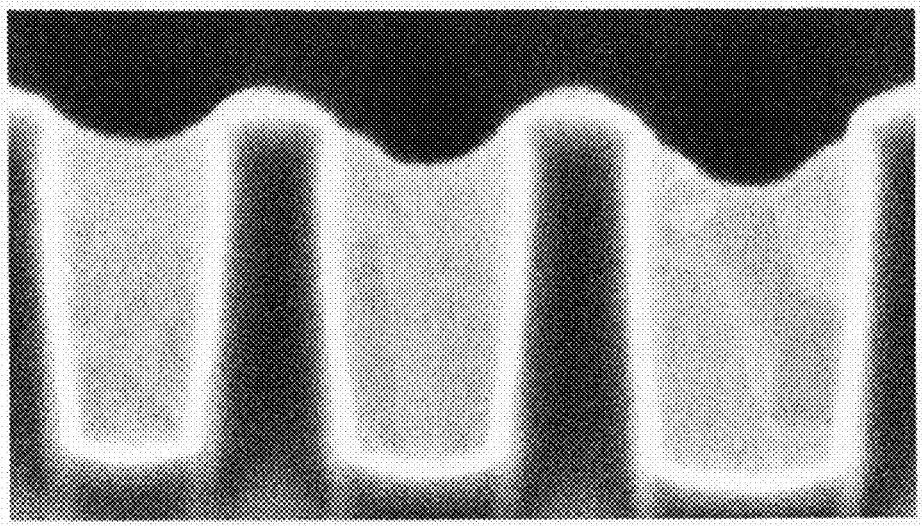
FIG. 10 is an SEM image of a trench array filled by a High Plasma Density Metal Fill method.

FIG. 10 presents an SEM image of a trench array that was filled with copper using a High Density Plasma Metal Fill. The depicted structure was obtained using the following process.

A wafer substrate (300 mm wafer) containing an array of trenches formed in a layer of dielectric was provided. The trenches had a minimal width of 120 nm and a height of 350 nm (aspect ratio of ~3:1). The substrate surface was lined with a layer of PVD-deposited Ta barrier. Prior to barrier deposition, the substrate was degassed for 40 seconds at 300° C.

The substrate was positioned on a wafer pedestal in an HCM PVD chamber equipped with a copper target. The temperature of the substrate was maintained at about −40° C. throughout copper deposition process. The plasma was ignited by applying a negative DC bias to the copper target at a power level of 70 kW No RF bias was applied to the wafer pedestal. At the beginning of the process argon was flown into the chamber at a flow rate of 10 sccm to ignite the plasma. After 1 second, the flow of argon was reduced to 2 sccm. The pressure within the chamber was maintained at about $7.10^{-5}$ Torr. High density plasma was obtained by using high magnetic confinement at the source. Specifically, currents of 12 A, 12 A, and 9 A were passed through three electromagnetic coils surrounding the target. Plasma was also magnetically confined below the separatrix, by using magnetic fields of lower intensity. The magnetic field at the target was estimated to be about 0.1-1 Tesla. The plasma density at the source was estimated to be about $10^{13}$ electrons/cm$^3$. The plasma density in the vicinity of the wafer was estimated to be about $10^{11}$ electrons/cm$^3$. The fractional ionization of copper at the wafer was estimated to be about 80%.

The recessed features were filled under these conditions, while the diffusion barrier material was simultaneously partially removed from the field region. The trenches were filled to about 95% of trench volume over the period of 45 seconds. The net deposition rate of copper within the trenches was about 75 Å/sec. The net etch rate of diffusion barrier in the field was about 5 Å/sec.

The microstructure of deposited copper was examined using SEM. Large copper grains having a height of about 3,000 Å and width of about 1,000 Å were found.

ALP Metal Fill

Figure 11:
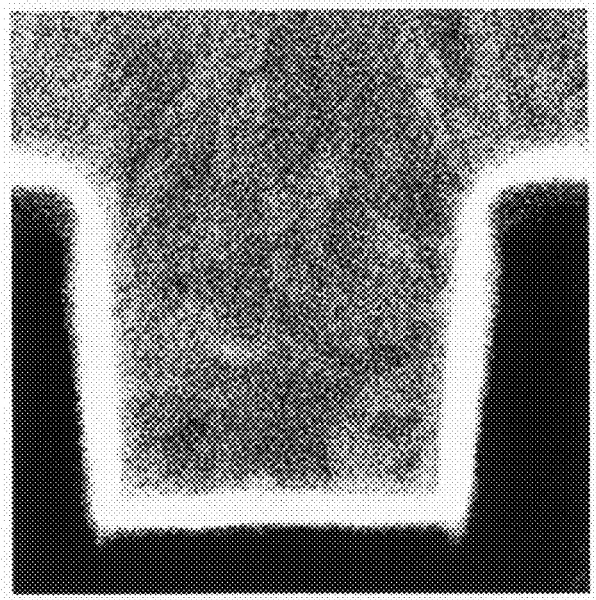
FIG. 11 is an SEM image of a trench filled by an ALP Metal Fill method.

FIG. 11 presents an SEM image of a trench that was filled with copper using an ALP Metal Fill. The depicted structure was obtained using the following process.

A wafer substrate (300 mm wafer) containing an array of trenches formed in a layer of dielectric was provided. The trenches had a width of 350 nm and a height of 350 nm (aspect ratio of 1:1). The substrate surface was lined with a layer of PVD-deposited Ta barrier. Prior to barrier deposition, the substrate was degassed for 40 seconds at 300° C.

The substrate was positioned on a wafer pedestal in an HCM PVD chamber equipped with a copper target. The temperature of the substrate was maintained at about −40° C. throughout copper deposition process. Argon was used as a process gas throughout ALP process The process starts by depositing copper at the trench bottoms. The thickness of deposited copper layer, as measured on the field was 100 Å. The deposition conditions are as follows: chamber pressure was maintained at about 7e-5 Torr, DC power applied to the target was 70 kW. This nucleation step was followed by an etchback step which removed 50 Å of material as measured in the field. Etchback was performed at RF power of 1200 W at the chamber pressure of ~4e-3 Torr.

The next ALP round is designed to build coverage to protect the feature corners and feature bottom from aggressive resputtering. It consists of 6 ALP cycles, where each cycle contains a depositing step which deposits 100 Å of copper, and an etching step which etches 50 Å of copper (both values measured in the field region). The etching operation in these 6 ALP cycles is performed under the same conditions as the etching operation of the first ALP cycle. The deposition step in these 6 ALP cycles is optimized for low overhang and runs at a higher pressure of 2e-4 Torr and at a reduced magnetic confinement as compared to the depositing operation of the first ALP cycle. The magnetic confinement (as well as the currents applied to the electromagnetic coils) was reduced by about 20% as compared to the deposition step of the first ALP cycle.

The last ALP round is designed to complete the feature fill. This round consists of 50 cycles of 100 Å-70 Å deposition/ etching with the deposition step optimized for the fill. In these cycles RF power of 600 W was applied to the wafer pedestal during deposition. The etching steps were performed under the same conditions as were described above. The DC power applied to the target in all ALP rounds was lower during the etch-back steps as compared to deposition steps in order to reduce metal flux derived from the target during etch-back. The application of RF power to the wafer pedestal during deposition is, generally optional, but was used in some deposition steps of this example.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of filling a recessed feature on a semiconductor substrate with a metal-containing material, the method comprising:
   (a) depositing a layer of the metal-containing material on the semiconductor substrate, to coat at least a bottom portion of the recessed feature; and
   (b) performing a plurality of profiling cycles, wherein each profiling cycle comprises a net etching operation removing a first portion of a material residing at the bottom of the recessed feature and a net deposition operation depositing a second portion of a material at the bottom of the recessed feature, wherein the net etching operation comprises redistributing the metal-containing material from the bottom portion of the recessed feature to the sidewalls of the recessed feature in at least some profiling cycles, and wherein performing the plurality of profiling cycles fills the recessed feature with the metal-containing material, wherein removing the first portion of a material residing at the bottom of the recessed feature comprises resputtering the material using high density plasma resputtering in at least some profiling cycles.

2. The method of claim 1, wherein the net etching operation reduces overhang material residing at the opening of the recessed feature during at least some of the profiling cycles.

3. The method of claim 1, wherein (b) fills at least about 80% of the volume of the recessed feature.

4. The method of claim 1, wherein (b) completely fills the recessed feature without forming a void.

5. The method of claim 1, wherein the metal-containing material comprises aluminum.

6. The method of claim 1, wherein the semiconductor substrate comprises a Damascene structure.

7. The method of claim 1, wherein (b) is performed in a plasma physical vapor deposition (PVD) process chamber.

8. The method of claim 1, wherein the method comprises performing at least some of the etching operations in a process chamber not having a metal target and performing at least some of the deposition operations in a plasma physical vapor deposition (PVD) process chamber equipped with a metal target.

9. The method of claim 1, wherein the recessed feature has a width of less than about 300 nm.

10. The method of claim 1, wherein (a) comprises depositing a layer of copper under the following conditions:

| | |
|---|---|
| Substrate temperature | −50-400° C. |
| Pressure | 0.005-0.5 mTorr |
| External RF substrate bias power | 0-300 W |
| DC target power | 20-100 kW |
| Argon flow rate | 0-10 sccm |

11. The method of claim 1, wherein in (b) the sidewalls of the recessed feature are exposed to alternating metal fluxes, wherein the first flux is directed from a metal target and the second flux is directed from the bottom of the recessed feature.

12. The method of claim 1, wherein (b) comprises performing between about 5-50 profiling cycles.

13. The method of claim 1, wherein in (b) the net deposition operation deposits between about 50-600 Å of metal-containing material in a field region of the substrate and wherein the net etch operation removes at least about 40% of the deposited material from the field region at least in some of the profiling cycles.

14. The method of claim 1, wherein at least some etching operations have an E/D ratio of at least about 2 in the field region.

15. The method of claim 1, wherein the net etching operation removes material at a net etch rate of at least about 5 Å/second at least in some profiling cycles.

16. The method of claim 1, wherein (b) comprises performing a first profiling cycle having a first net etching operation followed by a second profiling cycle having a second net etching operation, wherein the second net etch operation removes a larger fraction of the deposited material than the first net etch operation.

17. The method of claim 1, wherein in at least some of the net etching operations, a resputtering process gas comprises neon or helium.

18. The method of claim 1, wherein at least some net etching operations are performed under the following conditions:

| | |
|---|---|
| Substrate temperature | −50-400° C. |
| Pressure | 0.5-5 mTorr |
| External RF substrate bias power | 500-2000 W |
| DC target power | 0.5-10 kW |
| Argon flow rate | 10-200 sccm |

19. The method of claim 1, wherein the net deposition operation is performed under conditions which minimize formation of overhang for at least some of the profiling cycles.

20. The method of claim 1, wherein the metal-containing material comprises copper.

21. The method of claim 20, wherein the metal-containing material comprises a copper alloy, wherein said alloy is an electromigration resistance improving alloy or a diffusion barrier self-forming alloy.

22. The method of claim 1, wherein the high density plasma has a density of at least about $10^{10}$ electrons/cm$^3$ proximate to the substrate, and a mean ion energy of between about 100-700 eV.

23. The method of claim 22, wherein net etch is performed under the following conditions:

| | |
|---|---|
| Substrate temperature | −50-400° C. |
| Pressure | 0.5-5 mTorr |
| External RF substrate bias power | 200-500 W |
| DC target power | 0.5-10 kW |
| Argon flow rate | 10-200 sccm |

24. The method of claim 23, wherein the net deposition operation comprises applying an RF bias to the semiconductor substrate.

25. A method of processing a layer of material on a semiconductor substrate having a recessed feature, the method comprising:
(a) depositing a layer of material on the semiconductor substrate, to coat at least a bottom portion of the recessed feature; and
(b) performing a plurality of profiling cycles, wherein each profiling cycle comprises a net etching operation removing a first portion of a material residing at the bottom of the recessed feature and a net deposition operation depositing a second portion of a material at the bottom of the recessed feature, the deposited portion of the material being greater than the etched portion of the material for at least one of the profiling cycles, and wherein performing the plurality of profiling cycles achieves net material deposition at the bottom portion of the recessed feature, wherein the net etching operation comprises resputtering the material from the bottom of the recessed feature using high density plasma resputtering in at least some profiling cycles.

26. The method of claim 25, wherein the high density plasma has a density of at least about $10^{10}$ electrons/cm$^3$ proximate to the substrate, and a mean ion energy of between about 100-700 eV.

27. The method of claim 25, wherein net etch is performed under the following conditions:

| | |
|---|---|
| Substrate temperature | −50-400° C. |
| Pressure | 0.5-5 mTorr |
| External RF substrate bias power | 200-500 W |
| DC target power | 0.5-10 kW |
| Argon flow rate | 10-200 sccm |

28. The method of claim 25, wherein (b) comprises performing between about 5-50 profiling cycles.

29. A method of processing a layer of material on a semiconductor substrate having a recessed feature, the method comprising:
(a) depositing a layer of material on the semiconductor substrate to coat at least some portions of the substrate residing above the bottom of the recessed feature; and
(b) performing at least one profiling cycle, wherein the profiling cycle comprises a first operation and a second operation, said first operation comprising removing a first portion of a material residing above the bottom of the recessed feature and redistributing at least some of said material to the bottom of the recessed feature such that no net etching occurs at the bottom of the feature by resputtering the material residing above the bottom of the recessed feature under a pressure that is sufficient to reflect at least some of said material to the bottom of the recessed feature, said second operation comprising depositing a second portion of a material at least onto some portions of the substrate residing above the bottom of the recessed feature, wherein performing the at least one profiling cycle achieves net material deposition at the bottom of the recessed feature.

30. The method of claim 29, wherein the first operation comprises resputtering the material residing above the bottom of the recessed feature with a plasma comprising ions having atomic weight of greater than about 40.

31. The method of claim 29, wherein (b) fills at least about 80% of the volume of the recessed feature.

32. The method of claim 29, wherein (b) completely fills the recessed feature without forming a void.

33. The method of claim 29, wherein the first operation of the at least one profiling cycle comprises resputtering the material residing above the bottom of the recessed feature at a pressure of at least about 20 mTorr.

34. The method of claim 29, wherein the first operation of the at least one profiling cycle comprises resputtering the material residing above the bottom of the recessed feature at a pressure of between about 40-80 mTorr.

35. The method of claim 29, wherein the semiconductor substrate comprises a Damascene structure.

36. The method of claim 29, wherein the method comprises performing at least some of the etching operations in a process chamber not having a metal target and performing at least some of the deposition operations in a plasma physical vapor deposition (PVD) process chamber equipped with a metal target.

37. The method of claim 29, wherein the recessed feature has a width of less than about 300 nm.

38. The method of claim 29, wherein (a) comprises depositing a layer of copper under the following conditions:

| | |
|---|---|
| Substrate temperature | −50-400° C. |
| Pressure | 0.005-0.5 mTorr |
| External RF substrate bias power | 0-300 W |
| DC target power | 20-100 kW |
| Argon flow rate | 0-10 sccm |

39. The method of claim 29, wherein (b) comprises performing between about 5-50 profiling cycles.

40. The method of claim 29, wherein the deposited material comprises copper.

41. The method of claim 40, wherein the deposited material comprises a copper alloy, wherein said alloy is an electromigration resistance improving alloy or a diffusion barrier self-forming alloy.

42. An apparatus for filling recessed features on a wafer substrate, comprising:
(a) a process chamber configured to hold a metal target;
(b) a wafer support for holding the wafer in position during deposition of a metal-containing material; and
(c) a controller comprising program instructions for
(i) depositing a layer of the metal-containing material on the semiconductor substrate, to coat at least a bottom portion of a recessed feature; and
(ii) performing a plurality of profiling cycles, each cycle comprising a net etching and a net deposition operation at the bottom of the recessed feature, to fill the recessed feature with the metal-containing material, wherein program instructions for performing the plurality of profiling cycles comprise instructions for resputtering the metal-containing material using high density plasma resputtering in the net etching operation of at least some profiling cycles.

43. The apparatus of claim 42, wherein the apparatus comprises a planar magnetron.

44. The apparatus of claim 42, wherein the apparatus comprises a hollow cathode magnetron (HCM).

45. The apparatus of claim 42, wherein program instructions for high density plasma resputtering comprise instructions for generating a high density plasma having a density of at least about $10^{10}$ electrons/cm$^3$ proximate to the substrate, and a mean ion energy of between about 100-700 eV.

46. The apparatus of claim 42, wherein program instructions for high density plasma resputtering comprise instructions for setting the following process conditions:

| | |
|---|---|
| Substrate temperature | −50-400° C. |
| Pressure | 0.5-0.5 mTorr |
| External RF substrate bias power | 200-500 W |
| DC target power | 0.5-10 kW |
| Argon flow rate | 10-200 sccm |

47. An apparatus for filling recessed features on a wafer substrate, comprising:
(a) a process chamber configured to hold a metal target;
(b) a wafer support for holding the wafer in position during deposition of a metal-containing material; and
(c) a controller comprising program instructions for
(i) depositing a layer of the metal-containing material on the semiconductor substrate, to coat at least some portions of the substrate residing above the bottom of the recessed feature; and
(ii) performing at least one profiling cycle, wherein the profiling cycle comprises a first operation and a second operation, said first operation comprising removing a first portion of the metal-containing material residing above the bottom of the recessed feature and redistributing at least some of said material to the bottom of the recessed feature such that no net etching occurs at the bottom of the feature by resputtering the material residing above the bottom of the recessed feature under a pressure that is sufficient to reflect at least some of said material to the bottom of the recessed feature, said second operation comprising depositing a second portion of a material at least onto some portions of the substrate residing above the bottom of the recessed feature, wherein performing the at least one profiling cycle achieves net material deposition at the bottom of the recessed feature.

48. The apparatus of claim 47, wherein program instructions for the first operation of the at least one profiling cycle comprise instructions for resputtering the material residing above the bottom of the recessed feature with a plasma comprising ions having atomic weight of greater than about 40.

49. The apparatus of claim 47, wherein program instructions for the first operation of the at least one profiling cycle comprise instructions for resputtering the material residing above the bottom of the recessed feature at a pressure of at least about 20 mTorr.

50. The apparatus of claim 47, wherein program instructions for the first operation of the at least one profiling cycle comprise instructions for resputtering the material residing above the bottom of the recessed feature at a pressure of between about 40-80 mTorr.

51. The apparatus of claim 47, wherein the apparatus comprises a planar magnetron.

52. The apparatus of claim 47, wherein the apparatus comprises a hollow cathode magnetron (HCM).

53. An apparatus for filling recessed features on a wafer substrate, comprising:
(a) a first process chamber configured to hold a metal target and configured for depositing a metal-containing material;
(b) a second process chamber without a metal target and configured for material etching; and
(c) a controller comprising program instructions for
(i) depositing a layer of the metal-containing material on the semiconductor substrate, to coat at least a bottom portion of a recessed feature in the first process chamber; and
(ii) performing a plurality of profiling cycles, each cycle comprising a net etching and a net depositing operation at the bottom of the recessed feature, to fill the recessed features with the metal-containing material, wherein program instructions for performing the plurality of profiling cycles comprise instructions for resputtering the metal-containing material using high density plasma resputtering in the net etching operation of at least some profiling cycles, and for performing at least some of net etching operations in the second process chamber without a target.

54. The apparatus of claim 53, wherein the first chamber comprises a planar magnetron.

55. The apparatus of claim 53, wherein the first chamber comprises a hollow cathode magnetron (HCM).

56. The apparatus of claim 53, wherein program instructions for high density plasma resputtering comprise instructions for generating a high density plasma having a density of at least about $10^{10}$ electrons/cm$^3$ proximate to the substrate, and a mean ion energy of between about 100-700 eV.

57. An apparatus for filling recessed features on a wafer substrate, comprising:
(a) a first process chamber configured to hold a metal target and configured for depositing a metal-containing material;
(b) a second process chamber without a metal target and configured for material etching; and
(c) a controller comprising program instructions for
(i) depositing a layer of the metal-containing material on the semiconductor substrate, to coat at least some portions of the substrate residing above the bottom of the recessed feature, in the first process chamber; and
(ii) performing at least one profiling cycle, wherein the profiling cycle comprises a first operation and a second operation, said first operation comprising removing a first portion of the metal-containing material residing above the bottom of the recessed feature and redistributing at least some of said material to the bottom of the recessed feature such that no net etching occurs at the bottom of the feature by resputtering the material residing above the bottom of the recessed feature under a pressure that is sufficient to reflect at least some of said material to the bottom of the recessed feature in the second process chamber; said second operation comprising depositing a second portion of the metal-containing material at least onto some portions of the substrate residing above the bottom of the recessed feature in the first process chamber, wherein performing the at least one profiling cycle achieves net material deposition at the bottom of the recessed feature.

58. The apparatus of claim 57, wherein program instructions for the first operation of the at least one profiling cycle comprise instructions for resputtering the material residing above the bottom of the recessed feature with a plasma comprising ions having atomic weight of greater than about 40.

59. The apparatus of claim 57, wherein program instructions for the first operation of the at least one profiling cycle comprise instructions for resputtering the material residing above the bottom of the recessed feature at apressure of at least about 20 mTorr.

60. The apparatus of claim 57, wherein program instructions for the first operation of the at least one profiling cycle comprise instructions for resputtering the material residing above the bottom of the recessed feature at a pressure of between about 40-80 mTorr.

61. The apparatus of claim 57, wherein the first chamber comprises a planar magnetron.

62. The apparatus of claim 57, wherein the first chamber comprises a hollow cathode magnetron (HCM).

* * * * *